(12) United States Patent
Tajalli

(10) Patent No.: US 11,606,186 B2
(45) Date of Patent: Mar. 14, 2023

(54) HIGH PERFORMANCE PHASE LOCKED LOOP

(71) Applicant: Kandou Labs, S.A., Lausanne (CH)

(72) Inventor: Armin Tajalli, Lausanne (CH)

(73) Assignee: KANDOU LABS, S.A., Lausanne (CH)

( * ) Notice: Subject to any disclaimer, the term of this patent is extended or adjusted under 35 U.S.C. 154(b) by 0 days.

(21) Appl. No.: 17/684,273

(22) Filed: Mar. 1, 2022

(65) Prior Publication Data

US 2022/0191000 A1    Jun. 16, 2022

Related U.S. Application Data

(63) Continuation of application No. 16/813,526, filed on Mar. 9, 2020, now Pat. No. 11,265,140, which is a (Continued)

(51) Int. Cl.
*H04L 7/033* (2006.01)
*H04L 7/00* (2006.01)
(Continued)

(52) U.S. Cl.
CPC .............. *H04L 7/033* (2013.01); *H02M 3/07* (2013.01); *H03K 3/356* (2013.01); *H03K 5/26* (2013.01); *H03L 7/00* (2013.01); *H03L 7/0996* (2013.01); *H03L 7/0998* (2013.01); *H03L 7/104* (2013.01); *H04L 7/0012* (2013.01); *H04L 7/0025* (2013.01)

(58) Field of Classification Search
CPC ..... H04L 7/033; H04L 7/0012; H04L 7/0025; H03K 3/356; H03K 5/26; H02M 3/07; H03L 7/00; H03L 7/0996; H03L 7/0998; H03L 7/104
See application file for complete search history.

(56) References Cited

U.S. PATENT DOCUMENTS 4,839,907 A    6/1989   Saneski
5,266,907 A    11/1993  Dacus
(Continued)

FOREIGN PATENT DOCUMENTS

CN    203675093 U    6/2014
EP    0740423 A2     10/1996
JP    3615692 B2     11/2004

OTHER PUBLICATIONS

International Search Report and Written Opinion for PCT/US2017/029011, dated Jul. 13, 2017, 1-5 (5 pages).
(Continued)

*Primary Examiner* — Dac V Ha

(74) *Attorney, Agent, or Firm* — Invention Mine LLC

(57) ABSTRACT

Methods and systems are described for receiving N phases of a local clock signal and M phases of a reference signal, wherein M is an integer greater than or equal to 1 and N is an integer greater than or equal to 2, generating a plurality of partial phase error signals, each partial phase error signal formed at least in part by comparing (i) a respective phase of the M phases of the reference signal to (ii) a respective phase of the N phases of the local clock signal, and generating a composite phase error signal by summing the plurality of partial phase error signals, and responsively adjusting a fixed phase of a local oscillator using the composite phase error signal.

20 Claims, 17 Drawing Sheets

Related U.S. Application Data continuation of application No. 16/533,594, filed on Aug. 6, 2019, now Pat. No. 10,587,394, which is a continuation of application No. 16/107,822, filed on Aug. 21, 2018, now Pat. No. 10,374,787, which is a continuation of application No. 15/494,439, filed on Apr. 21, 2017, now Pat. No. 10,057,049.

(60) Provisional application No. 62/326,591, filed on Apr. 22, 2016.

(51) Int. Cl.
| | |
|---|---|
| H03K 3/356 | (2006.01) |
| H02M 3/07 | (2006.01) |
| H03K 5/26 | (2006.01) |
| H03L 7/099 | (2006.01) |
| H03L 7/00 | (2006.01) |
| H03L 7/10 | (2006.01) |

(56) References Cited

U.S. PATENT DOCUMENTS

| | | | |
|---|---|---|---|
| 5,302,920 | A | 4/1994 | Bitting |
| 5,528,198 | A | 6/1996 | Baba et al. |
| 5,565,817 | A | 10/1996 | Lakshmikumar |
| 5,602,884 | A | 2/1997 | Wieczorkiewicz et al. |
| 5,629,651 | A | 5/1997 | Mizuno |
| 5,802,356 | A | 9/1998 | Gaskins et al. |
| 6,026,134 | A | 2/2000 | Duffy et al. |
| 6,037,812 | A | 3/2000 | Gaudet |
| 6,122,336 | A | 9/2000 | Anderson |
| 6,307,906 | B1 | 10/2001 | Tanji et al. |
| 6,316,987 | B1 | 11/2001 | Dally et al. |
| 6,380,783 | B1 | 4/2002 | Chao et al. |
| 6,389,091 | B1 | 5/2002 | Yamaguchi et al. |
| 6,426,660 | B1 | 7/2002 | Ho et al. |
| 6,507,544 | B1 | 1/2003 | Ma et al. |
| 6,509,773 | B2 | 1/2003 | Buchwald et al. |
| 6,633,621 | B1 | 10/2003 | Bishop et al. |
| 6,650,699 | B1 | 11/2003 | Tierno |
| 6,717,478 | B1 | 4/2004 | Kim et al. |
| 6,838,951 | B1 | 1/2005 | Nieri et al. |
| 6,917,762 | B2 | 7/2005 | Kim |
| 7,078,978 | B2 | 7/2006 | Wakii |
| 7,102,449 | B1 | 9/2006 | Mohan |
| 7,158,441 | B2 | 1/2007 | Okamura |
| 7,199,728 | B2 | 4/2007 | Dally et al. |
| 7,336,112 | B1 | 2/2008 | Sha et al. |
| 7,532,697 | B1 | 5/2009 | Sidiropoulos et al. |
| 7,535,957 | B2 | 5/2009 | Ozawa et al. |
| 7,616,075 | B2 | 11/2009 | Kushiyama |
| 7,650,525 | B1 | 1/2010 | Chang et al. |
| 7,688,929 | B2 | 3/2010 | Co |
| 7,697,647 | B1 | 4/2010 | McShea |
| 7,822,113 | B2 | 10/2010 | Tonietto et al. |
| 7,839,229 | B2 | 11/2010 | Nakamura et al. |
| 7,852,109 | B1 | 12/2010 | Chan et al. |
| 7,860,190 | B2 | 12/2010 | Feller |
| 3,036,300 | A1 | 10/2011 | Evans et al. |
| 8,253,454 | B2 | 8/2012 | Lin |
| 8,407,511 | B2 | 3/2013 | Mobin et al. |
| 8,583,072 | B1 | 11/2013 | Ciubotaru et al. |
| 8,593,305 | B1 | 11/2013 | Tajalli et al. |
| 8,791,735 | B1 | 7/2014 | Shibasaki |
| 8,929,496 | B2 | 1/2015 | Lee et al. |
| 9,036,764 | B1 | 5/2015 | Hossain et al. |
| 9,059,816 | B1 | 6/2015 | Simpson et al. |
| 9,288,082 | B1 | 3/2016 | Ulrich et al. |
| 9,300,503 | B1 | 3/2016 | Holden et al. |
| 9,306,621 | B2 | 4/2016 | Zhang et al. |
| 9,374,250 | B1 | 6/2016 | Musah et al. |
| 9,397,868 | B1 | 7/2016 | Hossain et al. |
| 9,401,828 | B2 | 7/2016 | Cronie et al. |
| 9,438,409 | B1 | 9/2016 | Liao et al. |
| 9,461,862 | B2 | 10/2016 | Holden et al. |
| 9,520,883 | B2 | 12/2016 | Shibasaki |
| 9,565,036 | B2 | 2/2017 | Zerbe et al. |
| 9,577,815 | B1 | 2/2017 | Simpson et al. |
| 9,602,111 | B1 | 3/2017 | Shen et al. |
| 9,906,358 | B1 | 2/2018 | Tajalli |
| 9,960,902 | B1 | 5/2018 | Lin et al. |
| 10,003,315 | B2 | 6/2018 | Tajalli |
| 10,055,372 | B2 | 8/2018 | Shokrollahi |
| 10,057,049 | B2 | 8/2018 | Tajalli |
| 10,326,435 | B2 | 6/2019 | Arp et al. |
| 10,574,487 | B1 | 2/2020 | Hormati |
| 10,848,351 | B2 | 11/2020 | Hormati |
| 2003/0001557 | A1 | 1/2003 | Pisipaty |
| 2003/0146783 | A1 | 8/2003 | Bandy et al. |
| 2003/0212930 | A1 | 11/2003 | Aung et al. |
| 2003/0214977 | A1 | 11/2003 | Kuo |
| 2004/0092240 | A1 | 5/2004 | Hayashi |
| 2004/0141567 | A1 | 7/2004 | Yang et al. |
| 2005/0024117 | A1 | 2/2005 | Kubo et al. |
| 2005/0084050 | A1 | 4/2005 | Cheung et al. |
| 2005/0117404 | A1 | 6/2005 | Savoj |
| 2005/0128018 | A1 | 6/2005 | Meltzer |
| 2005/0141662 | A1 | 6/2005 | Sano et al. |
| 2005/0201491 | A1 | 9/2005 | Wei |
| 2005/0220182 | A1 | 10/2005 | Kuwata |
| 2005/0275470 | A1 | 12/2005 | Choi |
| 2006/0008041 | A1* | 1/2006 | Kim ............ H03L 7/0812 375/371 |
| 2006/0062058 | A1 | 3/2006 | Lin |
| 2006/0140324 | A1 | 6/2006 | Casper et al. |
| 2006/0232461 | A1 | 10/2006 | Felder |
| 2006/0233291 | A1 | 10/2006 | Garlepp et al. |
| 2007/0001713 | A1 | 1/2007 | Lin |
| 2007/0001723 | A1 | 1/2007 | Lin |
| 2007/0047689 | A1 | 3/2007 | Menolfi et al. |
| 2007/0058768 | A1 | 3/2007 | Werner |
| 2007/0086267 | A1 | 4/2007 | Kwak |
| 2007/0127612 | A1 | 6/2007 | Lee et al. |
| 2007/0146088 | A1 | 6/2007 | Arai et al. |
| 2007/0147559 | A1 | 6/2007 | Lapointe |
| 2007/0183552 | A1 | 8/2007 | Sanders et al. |
| 2007/0201597 | A1 | 8/2007 | He et al. |
| 2007/0253475 | A1 | 11/2007 | Palmer |
| 2008/0007367 | A1 | 1/2008 | Kim |
| 2008/0111634 | A1 | 5/2008 | Min |
| 2008/0136479 | A1 | 6/2008 | You et al. |
| 2008/0165841 | A1 | 7/2008 | Wall et al. |
| 2008/0181289 | A1 | 7/2008 | Moll |
| 2008/0219399 | A1 | 9/2008 | Nary |
| 2008/0317188 | A1 | 12/2008 | Staszewski et al. |
| 2009/0103675 | A1 | 4/2009 | Yousefi et al. |
| 2009/0167389 | A1 | 7/2009 | Reis |
| 2009/0195281 | A1 | 8/2009 | Tamura et al. |
| 2009/0231006 | A1 | 9/2009 | Jang et al. |
| 2009/0243679 | A1 | 10/2009 | Smith et al. |
| 2009/0262876 | A1 | 10/2009 | Arima et al. |
| 2009/0262877 | A1 | 10/2009 | Shi et al. |
| 2010/0033259 | A1 | 2/2010 | Miyashita |
| 2010/0090723 | A1 | 4/2010 | Nedovic et al. |
| 2010/0090735 | A1 | 4/2010 | Cho |
| 2010/0156543 | A1 | 6/2010 | Dubey |
| 2010/0180143 | A1 | 7/2010 | Ware et al. |
| 2010/0220828 | A1 | 9/2010 | Fuller et al. |
| 2011/0002181 | A1 | 1/2011 | Wang et al. |
| 2011/0025392 | A1 | 2/2011 | Wu et al. |
| 2011/0148498 | A1 | 6/2011 | Mosalikanti et al. |
| 2011/0234278 | A1 | 9/2011 | Seo |
| 2011/0268225 | A1 | 11/2011 | Cronie et al. |
| 2011/0302478 | A1 | 12/2011 | Cronie et al. |
| 2011/0311008 | A1 | 12/2011 | Slezak et al. |
| 2012/0051480 | A1 | 3/2012 | Usugi et al. |
| 2012/0170621 | A1 | 7/2012 | Tracy et al. |
| 2012/0200364 | A1 | 8/2012 | Iizuka et al. |
| 2012/0206177 | A1 | 8/2012 | Colinet et al. |
| 2012/0213299 | A1 | 8/2012 | Cronie et al. |
| 2012/0235717 | A1 | 9/2012 | Hirai et al. |
| 2012/0327993 | A1 | 12/2012 | Palmer |
| 2013/0088274 | A1 | 4/2013 | Gu |

(56) References Cited

U.S. PATENT DOCUMENTS

| | | |
|---|---|---|
| 2013/0091392 A1 | 4/2013 | Valliappan et al. |
| 2013/0093471 A1 | 4/2013 | Cho et al. |
| 2013/0107997 A1 | 5/2013 | Chen |
| 2013/0108001 A1 | 5/2013 | Chang et al. |
| 2013/0207706 A1 | 8/2013 | Yanagisawa |
| 2013/0243127 A1 | 9/2013 | Ito et al. |
| 2013/0271194 A1 | 10/2013 | Madoglio et al. |
| 2013/0285720 A1 | 10/2013 | Jibry |
| 2013/0314142 A1 | 11/2013 | Tamura et al. |
| 2014/0286381 A1 | 9/2014 | Shibasaki |
| 2014/0286457 A1 | 9/2014 | Chaivipas |
| 2015/0043627 A1 | 2/2015 | Kang et al. |
| 2015/0078495 A1 | 3/2015 | Hossain et al. |
| 2015/0117579 A1 | 4/2015 | Shibasaki |
| 2015/0180642 A1 | 6/2015 | Hsieh et al. |
| 2015/0220472 A1 | 8/2015 | Sengoku |
| 2015/0222458 A1 | 8/2015 | Hormati et al. |
| 2015/0249559 A1 | 9/2015 | Shokrollahi et al. |
| 2015/0256326 A1 | 9/2015 | Simpson et al. |
| 2016/0056980 A1 | 2/2016 | Wang et al. |
| 2016/0087610 A1 | 3/2016 | Hata |
| 2016/0134267 A1 | 5/2016 | Adachi |
| 2017/0228215 A1 | 8/2017 | Chatwin et al. |
| 2017/0310456 A1 | 10/2017 | Tajalli |
| 2018/0083763 A1 | 3/2018 | Black et al. |
| 2018/0083809 A1 | 3/2018 | Tajalli et al. |
| 2018/0219539 A1 | 8/2018 | Arp et al. |
| 2018/0227114 A1 | 8/2018 | Rahman et al. |
| 2018/0343011 A1 | 11/2018 | Tajalli et al. |
| 2018/0375693 A1 | 12/2018 | Zhou et al. |
| 2019/0109735 A1 | 4/2019 | Norimatsu |
| 2019/0377378 A1 | 12/2019 | Gharibdoust |
| 2020/0162233 A1 | 5/2020 | Lee et al. |
| 2021/0248103 A1 | 8/2021 | Khashaba et al. |
| 2021/0258029 A1* | 8/2021 | Cyzs .................. H04B 7/0854 |

OTHER PUBLICATIONS

Chang, Hong-Yeh , et al., "A Low-Jitter Low-Phase-Noise 10-GHz Sub-Harmonically Injection-Locked PLL With Self-Aligned DLL in 65-nm CMOS Technology", IEEE Transactions on Microwave Theory and Techniques, vol. 62, No. 3, Mar. 2014, 543-555 (13 pages).

Ha, J.C. , et al., "Unified All-Digital Duty-Cycle and phase correction circuit for QDR I/O interface", Electronic Letters, The Institution of Engineering and Technology, vol. 44, No. 22, Oct. 23, 2008, 1300-1301 (2 pages).

Loh, Mattew , et al., "A 3×9 Gb/s Shared, All-Digital CDR for High-Speed, High-Density I/O", IEEE Journal of Solid-State Circuits, vol. 47, No. 3, Mar. 2012, 641-651 (11 pages).

Nandwana, Romesh Kumar, et al., "A Calibration-Free Fractional-N Ring PLL Using Hybrid Phase/Current-Mode Phase Interpolation Method", IEEE Journal of Solid-State Circuits, vol. 50, No. 4, Apr. 2015, 882-895 (14 pages).

Ng, Herman Jalli, et al., "Low Phase Noise 77-GHz Fractional-N PLL with DLL-based Reference Frequency Multiplier for FMCW Radars", European Microwave Integrated Circuits Conference, Oct. 10-11, 2011, 196-199(4 pages).

Riley, M. W., et al., "Cell Broadband Engine Processor: Design and Implementation", IBM Journal of Research and Development, vol. 51, No. 5, Sep. 2007, 545-557 (13 pages).

Ryu, Kyungho , et al., "Process-Variation-Calibrated Multiphase Delay Locked Loop With a Loop-Enbedded Duty Cycle Corrector", IEEE Transactions on Circuits and Systems, vol. 61, No. 1, Jan. 2014, 1-5 (5 pages).

Tajalli, Armin , "Wideband PLL Using Matrix Phase Comparator", Journal of Latex Class Files, vol. 14, No. 8, Aug. 2016, 1-8 (8 pages).

Tan, Han-Yuan , "Design of Noise-Robust Clock and Data Recovery Using an Adaptive-Bandwidth Mixed PLL/DLL", Harvard University Thesis, Nov. 2006, 1-169 (169 pages).

Wang, Yi-Ming , et al., "Range Unlimited Delay-Interleaving and -Recycling Clock Skew Compensation and Duty-Cycle Correction Circuit", IEEE Transactions on Very Large Scale Integration (VLSI) Systems, vol. 23, No. 5, May 2015, 856-868 (13 pages).

Cui, Delong , et al., "A Dual-Channel 23-Gbps CMOS Transmitter/ Receiver Chipset for 40-Gbps RZ-DQPSK and CS-RZ-DQPSK Optical Transmission", IEEE Journal of Solid-State Circuits, vol. 47, No. 12, Dec. 2012, 3249-3260 (12 pages).

Inti, Rajesh , et al., "A 0.5-to-2.5 Gb/s Reference-Less Half-Rate Digital CDR with Unlimited Frequency Acquisition Range and Improved Input Duty-Cycle Error Tolerance", IEEE Journal of Solid-State Circuits, vol. 46, No. 12, Dec. 2011, 3150-3162 (13 pages).

Pozzoni, Massimo , et al., "A Multi-Standard 1.5 to 10 Gb/s Latch-Based 3-Tap DFE Receiver with a SSC Tolerant CDR for Serial Backplane Communication", IEEE Journal of Solid-State Circuits, vol. 44, No. 4, Apr. 2009, 1306-1315 (10 pages).

Shu, Guanghua , et al., "A 4-to-10.5 Gb/s Continuous-Rate Digital Clock and Data Recovery With Automatic Frequency Acquisition", IEEE Journal of Solid-State Circuits, vol. 51, No. 2, Feb. 2016, 428-439 (12 pages).

Yoo, Danny , et al., "A 36-Gb/s Adaptive Baud-Rate CDR with CTLE and 1-Tap DFE in 28-nm CMOS", IEEE Solid-State Circuits Letters, vol. 2, No. 11, Nov. 2019, 252-255 (4 pages).

Zaki, Ahmed M., "Adaptive Clock and Data Recovery for Asymmetric Triangular Frequency Modulation Profile", IEEE Pacific Rim Conference on Communications, Computers and Signal Processing (PACRIM), Aug. 21, 2019, 1-6 (6 pages).

* cited by examiner

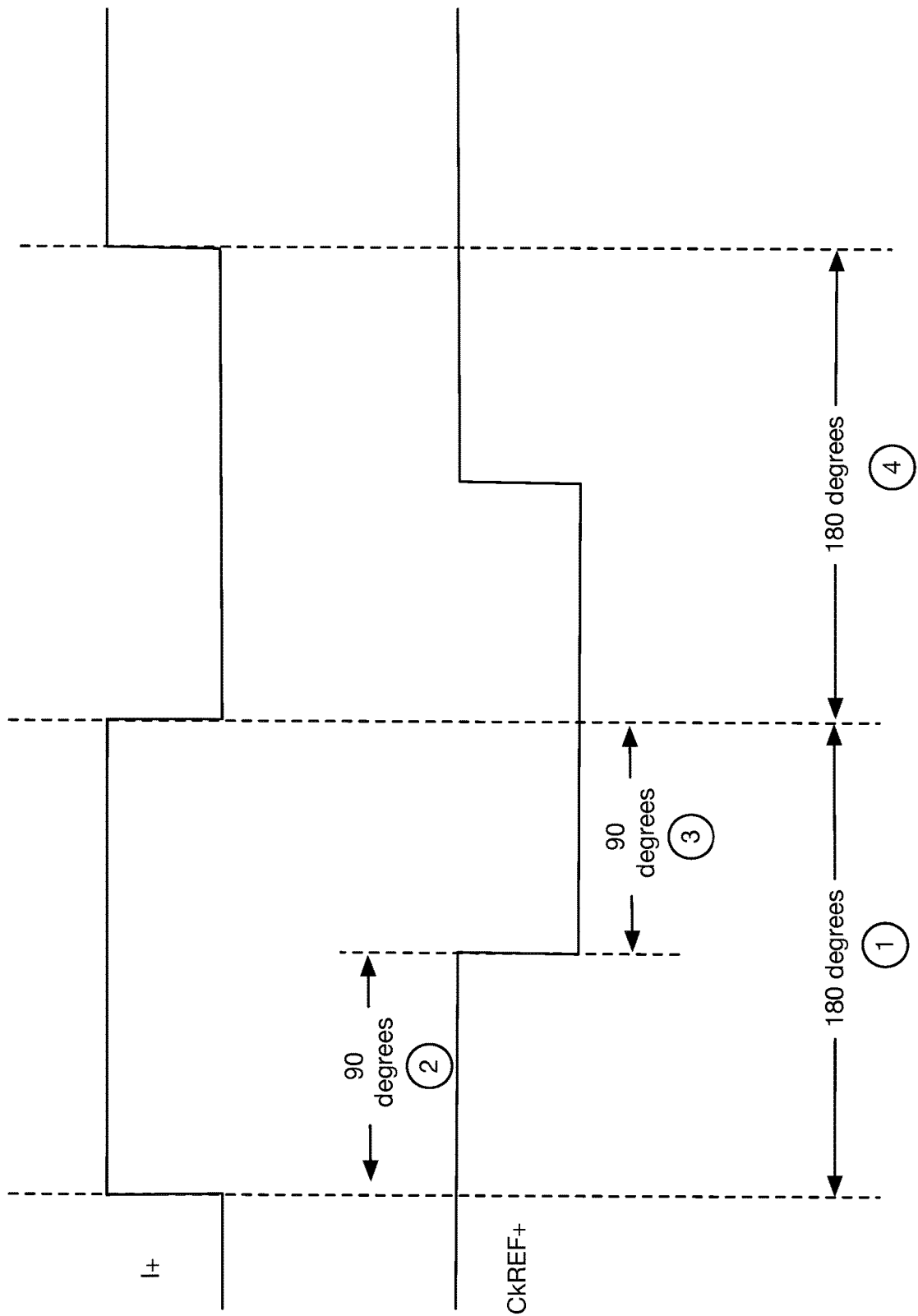

HIGH PERFORMANCE PHASE LOCKED LOOP

CROSS REFERENCE TO RELATED APPLICATIONS

This Application is a Continuation of application Ser. No. 16/813,526, filed Mar. 9, 2020, entitled High Performance Phase Locked Loop", naming Armin Tajalli, which is a Continuation of application Ser. No. 16/533,594, filed Aug. 6, 2019, entitled High Performance Phase Locked Loop", naming Armin Tajalli, which is a Continuation of application Ser. No. 16/107,822, filed Aug. 21, 2018, entitled "High Performance Phase Locked Loop", naming Armin Tajalli, which is a Continuation of application Ser. No. 15/494,439 filed Apr. 21, 2017, entitled, "High Performance Phase Locked Loop," naming Armin Tajalli, which claims the benefit of U.S. Provisional Application No. 62/326,591 filed Apr. 22, 2016, entitled "High Performance Phase Locked Loop", naming Armin Tajalli, all of which are hereby incorporated by reference in their entirety for all purposes.

REFERENCES

The following prior applications are herein incorporated by reference in their entirety for all purposes:

U.S. Patent Publication 2011/0268225 of application Ser. No. 12/784,414, filed May 20, 2010, naming Harm Cronie and Amin Shokrollahi, entitled "Orthogonal Differential Vector Signaling" (hereinafter "Cronie I").

U.S. Patent Publication 2011/0302478 of application Ser. No. 12/982,777, filed Dec. 30, 2010, naming Harm Cronie and Amin Shokrollahi, entitled "Power and Pin Efficient Chip-to-Chip Communications with Common-Mode Resilience and SSO Resilience" (hereinafter "Cronie II").

U.S. patent application Ser. No. 13/030,027, filed Feb. 17, 2011, naming Harm Cronie, Amin Shokrollahi and Armin Tajalli, entitled "Methods and Systems for Noise Resilient, Pin-Efficient and Low Power Communications with Sparse Signaling Codes" (hereinafter "Cronie III")

U.S. patent application Ser. No. 13/176,657, filed Jul. 5, 2011, naming Harm Cronie and Amin Shokrollahi, entitled "Methods and Systems for Low-power and Pin-efficient Communications with Superposition Signaling Codes" (hereinafter "Cronie IV").

U.S. patent application Ser. No. 13/542,599, filed Jul. 5, 2012, naming Armin Tajalli, Harm Cronie, and Amin Shokrollahi entitled "Methods and Circuits for Efficient Processing and Detection of Balanced Codes" (hereafter called "Tajalli I".)

U.S. patent application Ser. No. 13/842,740, filed Mar. 15, 2013, naming Brian Holden, Amin Shokrollahi and Anant Singh, entitled "Methods and Systems for Skew Tolerance in and Advanced Detectors for Vector Signaling Codes for Chip-to-Chip Communication", hereinafter identified as [Holden I];

U.S. Provisional Patent Application No. 61/946,574, filed Feb. 28, 2014, naming Amin Shokrollahi, Brian Holden, and Richard Simpson, entitled "Clock Embedded Vector Signaling Codes", hereinafter identified as [Shokrollahi I].

U.S. patent application Ser. No. 14/612,241, filed Aug. 4, 2015, naming Amin Shokrollahi, Ali Hormati, and Roger Ulrich, entitled "Method and Apparatus for Low Power Chip-to-Chip Communications with Constrained ISI Ratio", hereinafter identified as [Shokrollahi II].

U.S. patent application Ser. No. 13/895,206, filed May 15, 2013, naming Roger Ulrich and Peter Hunt, entitled "Circuits for Efficient Detection of Vector Signaling Codes for Chip-to-Chip Communications using Sums of Differences", hereinafter identified as [Ulrich I].

U.S. patent application Ser. No. 14/816,896, filed Aug. 3, 2015, naming Brian Holden and Amin Shokrollahi, entitled "Orthogonal Differential Vector Signaling Codes with Embedded Clock", hereinafter identified as [Holden II].

U.S. patent application Ser. No. 14/926,958, filed Oct. 29, 2015, naming Richard Simpson, Andrew Stewart, and Ali Hormati, entitled "Clock Data Alignment System for Vector Signaling Code Communications Link", hereinafter identified as [Stewart I].

U.S. patent application Ser. No. 14/925,686, filed Oct. 28, 2015, naming Armin Tajalli, entitled "Advanced Phase Interpolator", hereinafter identified as [Tajalli II].

U.S. Provisional Patent Application No. 62/286,717, filed Jan. 25, 2016, naming Armin Tajalli, entitled "Voltage Sampler Driver with Enhanced High-Frequency Gain", hereinafter identified as [Tajalli III].

The following additional references to prior art have been cited in this application:

U.S. Pat. No. 6,509,773, filed Apr. 30, 2001 by Buchwald et al., entitled "Phase interpolator device and method" (hereafter called [Buchwald].

"Linear phase detection using two-phase latch", A. Tajalli, et al., IEE Electronic Letters, 2003, (hereafter called [Tajalli IV].)

"A Low-Jitter Low-Phase-Noise 10-GHz Sub-Harmonically Injection-Locked PLL With Self-Aligned DLL in 65-nm CMOS Technology", Hong-Yeh Chang, Yen-Liang Yeh, Yu-Cheng Liu, Meng-Han Li, and Kevin Chen, IEEE Transactions on Microwave Theory and Techniques, Vol 62, No. 3, March 2014 pp. 543-555, (hereafter called [Chang et al.])

"Low Phase Noise 77-GHz Fractional-N PLL with DLL-based Reference Frequency Multiplier for FMCW Radars", Herman Jalli Ng, Rainer Stuhlberger, Linus Maurer, Thomas Sailer, and Andreas Stelzer, Proceedings of the 6th European Microwave Integrated Circuits Conference, 10-11 Oct. 2011, pp. 196-199, (hereafter called [Ng et al.])

"Design of Noise-Robust Clock and Data Recovery using an Adaptive-Bandwidth Mixed PLL/DLL", Han-Yuan Tan, Doctoral Thesis, Harvard University November 2006, (hereafter called [Tan]).

FIELD OF THE INVENTION

The present embodiments relate to communications systems circuits generally, and more particularly to obtaining a stable, correctly phased receiver clock signal from a high-speed multi-wire interface used for chip-to-chip communication.

BACKGROUND

In modern digital systems, digital information has to be processed in a reliable and efficient way. In this context, digital information is to be understood as information available in discrete, i.e., discontinuous values. Bits, collection of bits, but also numbers from a finite set can be used to represent digital information.

In most chip-to-chip, or device-to-device communication systems, communication takes place over a plurality of wires to increase the aggregate bandwidth. A single or pair of these wires may be referred to as a channel or link and multiple channels create a communication bus between the electronic components. At the physical circuitry level, in chip-to-chip communication systems, buses are typically made of electrical conductors in the package between chips and motherboards, on printed circuit boards ("PCBs") boards or in cables and connectors between PCBs. In high frequency applications, microstrip or stripline PCB traces may be used.

Common methods for transmitting signals over bus wires include single-ended and differential signaling methods. In applications requiring high speed communications, those methods can be further optimized in terms of power consumption and pin-efficiency, especially in high-speed communications. More recently, vector signaling methods have been proposed to further optimize the trade-offs between power consumption, pin efficiency and noise robustness of chip-to-chip communication systems. In such vector signaling systems, digital information at the transmitter is transformed into a different representation space in the form of a vector codeword that is chosen in order to optimize the power consumption, pin-efficiency and speed trade-offs based on the transmission channel properties and communication system design constraints. Herein, this process is referred to as "encoding". The encoded codeword is communicated as a group of signals from the transmitter to one or more receivers. At a receiver, the received signals corresponding to the codeword are transformed back into the original digital information representation space. Herein, this process is referred to as "decoding".

Regardless of the encoding method used, the received signals presented to the receiving device must be sampled (or their signal value otherwise recorded) at intervals best representing the original transmitted values, regardless of transmission channel delays, interference, and noise. Such Clock and Data Recovery (CDR) not only determines the appropriate sample timing, but may continue to do so continuously, providing dynamic compensation for varying signal propagation conditions.

Many known CDR systems utilize a Phase-Locked Loop (PLL) or Delay-Locked Loop (DLL) to synthesize a local receive clock having an appropriate frequency and phase for accurate receive data sampling.

BRIEF DESCRIPTION

To reliably detect the data values transmitted over a communications system, a receiver must accurately measure the received signal value amplitudes at carefully selected times. Various methods are known to facilitate such receive measurements, including reception of one or more dedicated clock signals associated with the transmitted data stream, extraction of clock signals embedded within the transmitted data stream, and synthesis of a local receive clock from known attributes of the communicated data stream.

In general, the receiver embodiments of such timing methods are described as Clock-Data Recovery (CDR), often based on Phase-Lock Loop (PLL) or Delay-Locked Loop (DLL) synthesis of a local receive clock having the desired frequency and phase characteristics.

In both PLL and DLL embodiments, a phase comparator compares the relative phase (and in some variations, the relative frequency) of a received reference signal and a local clock signal to produce an error signal, which is subsequently used to correct the phase and/or frequency of the local clock source and thus minimize the error. As this feedback loop behavior will lead to a given PLL embodiment producing a fixed phase relationship (as examples, 0 degrees or 90 degrees of phase offset) between the reference signal and the local clock, an additional fixed or variable phase adjustment is often introduced to permit the phase offset to be set to a different desired value (as one example, 45 degrees of phase offset) to facilitate receiver data detection.

Below, methods and systems are described for receiving N phases of a local clock signal and M phases of a reference signal, wherein M is an integer greater than or equal to 1 and N is an integer greater than or equal to 2, generating a plurality of partial phase error signals, each partial phase error signal formed at least in part by comparing (i) a respective phase of the M phases of the reference signal to (ii) a respective phase of the N phases of the local clock signal, and generating a composite phase error signal by summing the plurality of partial phase error signals, and responsively adjusting a fixed phase of a local oscillator using the composite phase error signal.

In some embodiments, M=1, and N partial phase error signals are summed to generate the composite phase error signal. Alternatively, the plurality of partial phase error signals includes M=N partial phase error signals, and wherein a given phase of the N phases of the local clock signal and a given phase of the M phases of the reference signal are each used to generate a single partial phase error signal. In further alternative embodiments, the plurality of partial phase error signals includes M×N partial phase error signals, and wherein each phase of the N phases of the local clock signal is compared to each phase of the M phases of the reference signal.

In some embodiments, each partial phase error signal of the plurality of partial phase error signals has a corresponding weight applied to it. In some embodiments, the weights are selected according to an M×N matrix.

In some embodiments, the M phases of the reference signal are received from a delay-lock loop operating on an input reference signal.

In some embodiments, at least one of the N phases of the local clock signal is generated using a phase interpolator operating on local oscillator signals and a phase offset signal. In some embodiments, generating at least one of the N phases of the local clock signal includes interpolating 4 phases using 4 differential pairs in the phase interpolator, each of the 4 phases being interpolated according to a corresponding differential pair connected to an independently tunable current source.

In some embodiments, at least one partial phase error signal is generated using a pair of flip-flops, wherein a first flip-flop of the pair of flip-flops is clocked using a given phase of the M phases of the reference signal and a second flip-flop is clocked using a given phase of the N phases of the local clock signal.

In some embodiments, each partial phase error signal is an analog signal generated using a respective charge pump, the respective charge pump receiving respective charge pump control signals generated by a respective comparison between the respective phase of the M phases of the reference signal and the respective phase of the N phases of the local clock signal.

Embodiments are described in which the Phase Detection and phase adjustment elements are combined, leading to lower circuit node capacitance and reduced circuit delays, these improvements in turn enabling increased loop stability and improved PLL lock characteristics, including increased loop lock bandwidth leading to lower clock jitter and improved power supply noise rejection.

Embodiments are also described in which a Delay-Locked Loop is used to convert the received reference clock signal into multiple reference clock phases, converting the PLL phase comparison operation into multiple comparisons made between a reference clock phase and a local clock phase. A summation or weighted summation of the multiple comparison results is then used as the error feedback signal for the PLL. A further embodiment is described in which multiple comparisons are made between a single received reference clock phase and multiple local clock phases, with the weighted sum of the multiple comparison results used as the error feedback term for the PLL. In at least one such further embodiment, said weighted sums comprise a two dimensional time domain filter.

BRIEF DESCRIPTION OF FIGURES

FIG. 13A is a timing diagram for a folded phase comparator, in accordance with some embodiments.

DETAILED DESCRIPTION

Figure 1:
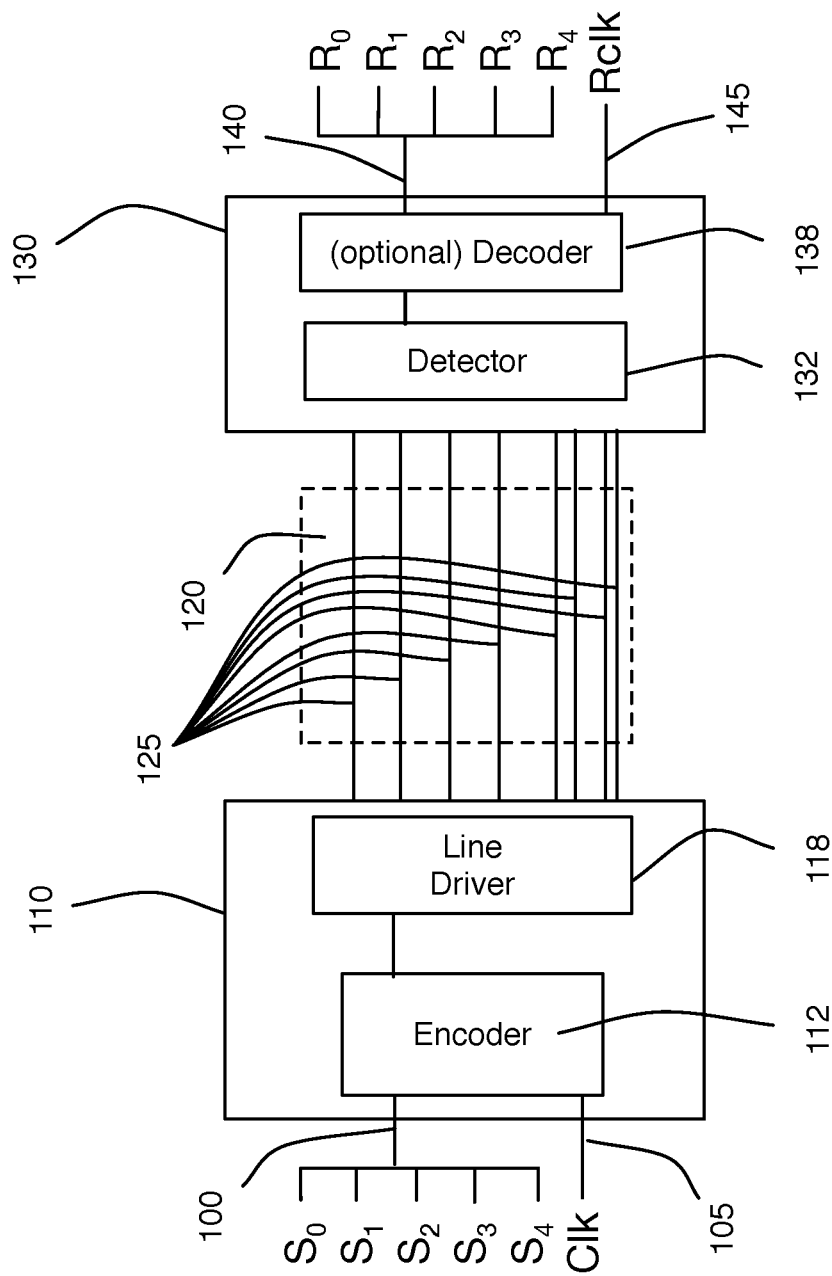
FIG. 1 is a block diagram of one embodiment capable of encoding and transmitting five data bits and a clock on an eight wire communications channel.

As described in [Cronie I], [Cronie II], [Cronie III] and [Cronie IV], vector signaling codes may be used to produce extremely high bandwidth data communications links, such as between two integrated circuit devices in a system. As illustrated by the embodiment of FIG. 1, multiple data communications channels transmit symbols of the vector signaling code, acting together to communicate codewords of the vector signaling code. Depending on the particular vector signaling code used, the number of channels comprising a communications link may range from two to eight or more, and may also communicate one or more clock signals on separate communications channels or as subchannel components of the vector signaling code. In the example of FIG. 1, communication link 120 is illustrated as being composed of eight wires 125, collectively communicating five data values 100 and one clock 105 between transmitter 110 and receiver 130.

Individual symbols, e.g. transmissions on any single communications channel, may utilize multiple signal levels, often three or more. Operation at channel rates exceeding 10 Gbps may further complicate receive behavior by requiring deeply pipelined or parallelized signal processing, precluding reception methods in which the previous received value is known as the current value is being received.

Embodiments described herein can also be applied to prior art permutation sorting methods not covered by the vector processing methods of [Cronie II], [Cronie III], [Cronie IV], and/or [Tajalli I]. More generally, embodiments can apply to any communication or storage methods requiring coordination of multiple channels or elements of the channel to produce a coherent aggregate result.

Receiver Data Detection

To provide context for the following examples, one typical high-speed receiver embodiment [Stewart I] is used for illustrative purposes, without limitation.

Figure 2:
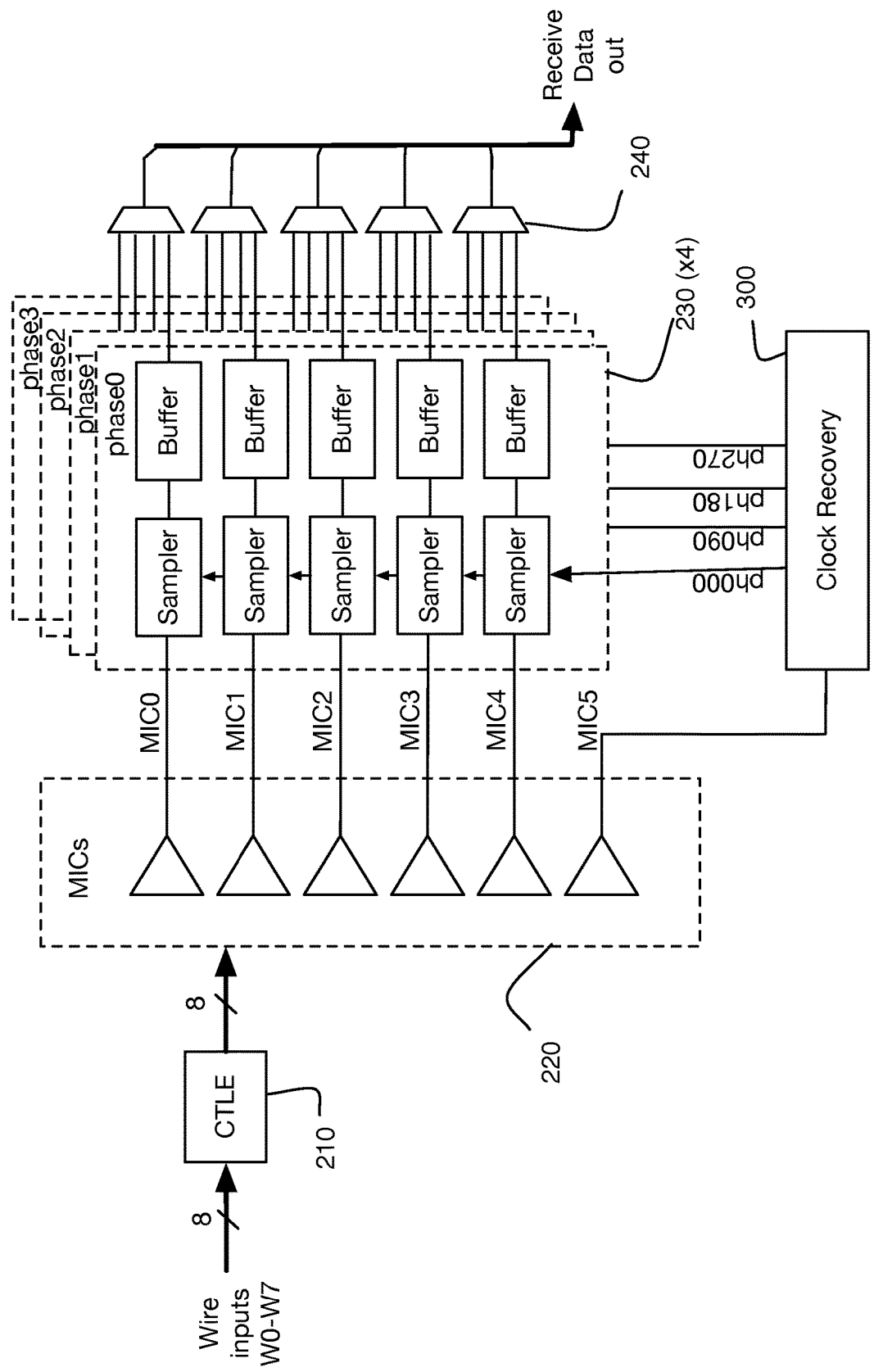
FIG. 2 is a block diagram of one embodiment of a receiver compatible with the transmitter of FIG. 1.

As illustrated in FIG. 2, the example data receiver includes eight identical Continuous Time Linear Equalization (CTLE) stages 210 operating on the signals received on the eight wires, previously shown as 120 in FIG. 1.

As described in [Tajalli I], [Holden I] and [Ulrich I], vector signaling codes may be efficiently detected by linearly combining sets of input signals using Multi-Input comparators or mixers (MIC). For the 5b6w code used by the example receiver, five such mixers acting on weighted subsets of the six received data input signals will detect the five data bits without need of further decoding. One additional mixer acting on combinations of the two received clock signals will similarly detect the clock signal. In FIG. 2, this set of six MIC mixers 220 operate on the received and equalized signals to produce detected signals MIC0-MIC5.

Because of the high data rates involved, multiple parallel phases of receive processing may be used in the example receiver. In one embodiment, the five detected data signals MIC0-MIC4 are processed in four parallel phases of receive data processing, each phase 230 including five data samplers and subsequent buffering, followed by recombination of the four phase outputs into a received data stream, shown in FIG. 2 as being performed by multiplexers 240.

Clock Recovery circuits (also known in the art as Clock Data Recovery or CDR) support such sampling measurements by extracting timing information, either from the data lines themselves or from dedicated clock signal inputs, and utilize that extracted information to generate clock signals to control the time interval used by the data line sampling device(s). The actual clock extraction may be performed using well known circuits such as a Phase Locked Loop (PLL) or Delay Locked Loop (DLL), which in their operation may also generate higher frequency internal clocks, multiple clock phases, etc. in support of receiver operation. In the embodiment of FIG. 2, the detected clock signal is obtained at MIC5 and processed 300 to extract properly timed sampling clocks for the four data phases.

PLL Overview

Phase Locked Loops are well represented in the literature. A typical PLL is composed of a phase comparator that compares an external reference signal to an internal clock signal, a low pass filter that smooths the resulting error value to produce a clock control signal, and a variable frequency clock source (typically, a Voltage Controlled Oscillator or VCO) controlled by the smoothed error value, producing the internal clock signal presented to the phase comparator. In a well-know variation, such a PLL design may incorporate a clock frequency divider between the VCO and the phase comparator, allowing a higher-frequency clock output to be phase locked to a lower-frequency reference signal.

In an alternative embodiment, the variable frequency clock source is replaced by a variable delay element, its (optionally multiple tapped) outputs thus representing one or more successive time-delayed versions of the original input signal rather than successive cycles of an oscillator to be phase compared to the reference input signal. For the purposes of this document, such Delay Locked Loops (DLL) are considered functionally equivalent to a PLL in such an application, particularly in regard to comprised elements of phase comparator, phase interpolator, and charge pump.

Numerous forms of phase comparators are known to the art. A simple XOR gate as in FIG. 4A may be used to compare, as a non-limiting example, two square wave signals. One familiar with the art will observe that such a digital XOR output will be a variable-duty-cycle waveform which, when low pass filtered into an analog error signal, results in a proportional error signal centered in its analog signal range when the two input signals have a 90-degree phase offset relationship.

Figure 4A:
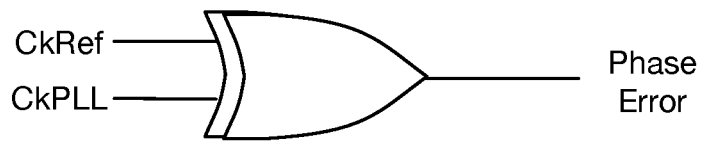
FIGS. 4A, 4B, and 4C show three Phase comparator embodiments suitable for use in a Phase Locked Loop element of a clock recovery circuit.
Figure 4B:
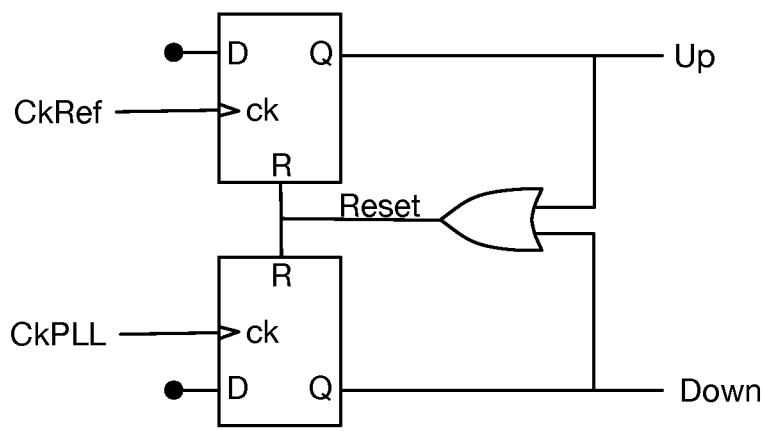

The more complex state machine phase comparator of FIG. 4B is composed of two edge-triggered latches clocked respectively by the reference and internal clock signals, with the first received clock edge initiating an output signal on one of the "early" or "late" outputs. Either output becoming active will subsequently cause the latches to reset in anticipation of the next comparison interval. Alternative embodiments may incorporate a timing delay in this reset path to provide additional control of the reset pulse timing. The "late" and "early" phase comparison outputs are typically accepted as "pump up" and "pump down" inputs to a charge pump, the output of which is the analog error value. That is, a pump-up signal may turn on a first transistor circuit that provides charge to capacitor thereby increasing the analog voltage, while a pump down signal may turn on a second transistor circuit that removes charge from a capacitor, thereby reducing the voltage. A zero-degree phase offset between the two input clock signals will thus leave the analog error value unchanged and the PLL in a stable locked condition. Several equivalent state machine phase comparator embodiments are known in the art, and are equally applicable in this application, without implication of limitation. Some state machine embodiments may be sensitive to both phase and frequency differences between the input signals, facilitating more rapid PLL lock acquisition on startup.

Figure 4C:
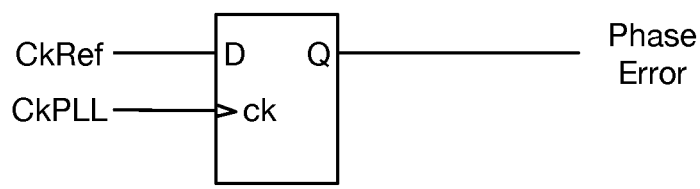

As shown in FIG. 4C, a simple edge-clocked "D" flip-flop may also be used as a phase comparator. At each rising local clock edge (CkPLL), the D input samples the state of the (in this example, square wave) reference input (CkRef); if it is high (e.g. it has already transitioned) the Q output is high indicating the reference is "early", if it is low (e.g. it has not yet transitioned) Q is low indicating the reference is "late". This so-called "bang/bang" phase comparator provides a less nuanced error result than the previous example, thus more sophisticated filtering may be performed to obtain loop stability.

As will be recognized by those familiar with the art, comparable functional operation may be obtained regardless of the phase comparator type incorporated in a PLL design, thus to first approximation phase comparator choice is not limiting. Secondary design behaviors, including lock time, stability, power consumption, etc. must also be considered as part of the design process.

Receiver Clock Recovery

Figure 3:
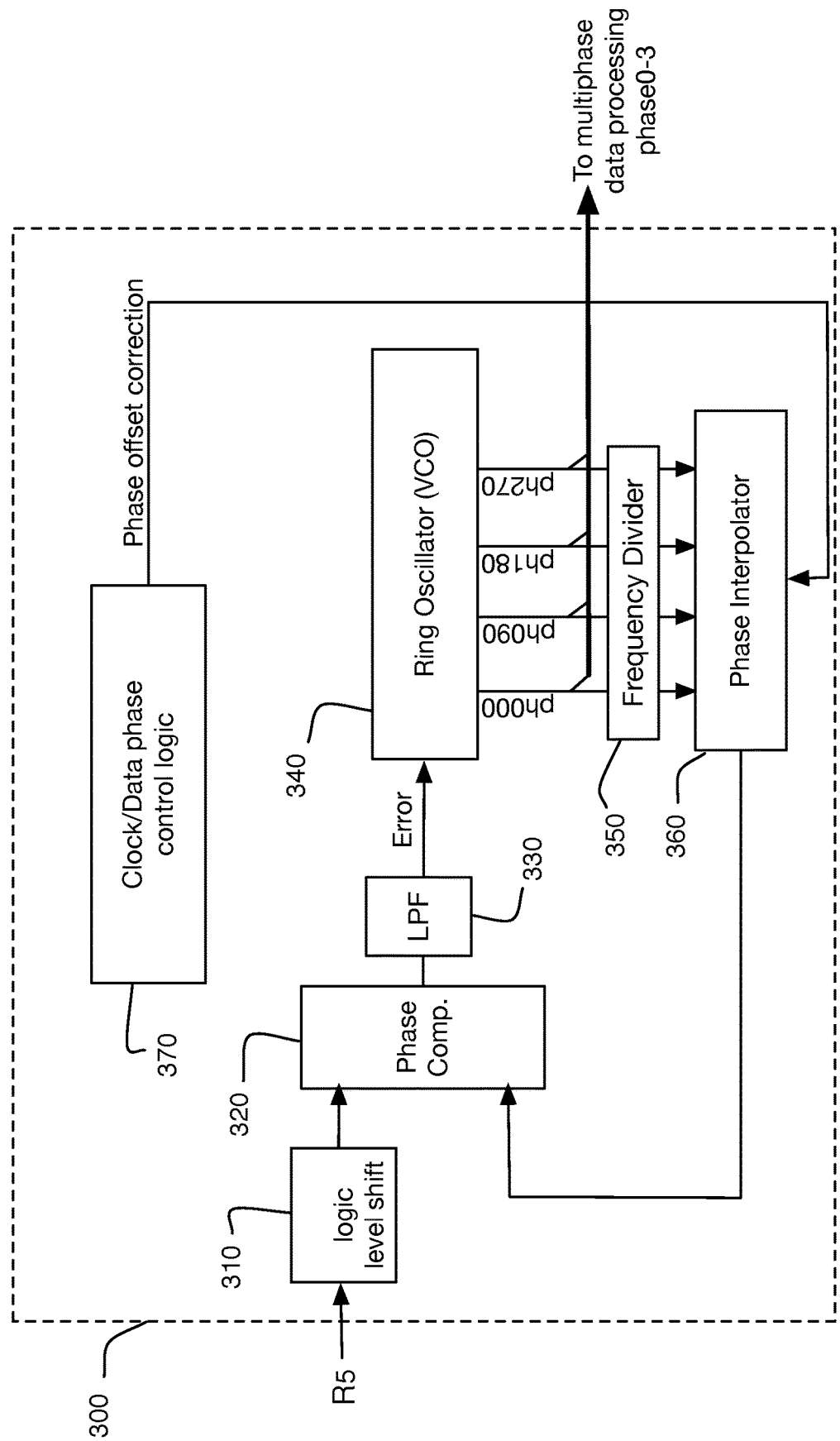
FIG. 3 is a block diagram detailing one embodiment of the clock recovery circuit used by the receiver of FIG. 2.

The example receiver utilizes a PLL embodiment as shown in FIG. 3. This PLL accepts the received clock signal R5 as the reference to which its clocks will be phased locked. In some embodiments, logic level shift 310 is used if appropriate to interface between the signal levels provided by the detecting MIC and the preferred phase comparator input levels. Phase Comparator 320 compares the reference clock to a local clock derived from the VCO, producing an output which is low pass filtered to provide an Error value which subsequently corrects the operating frequency of VCO 340. In some embodiments, the outputs of Phase Comparator 320 is a digital waveform requiring conversion to an analog error signal, either through implicit or explicit digital to analog conversion, or by use of an interface element such as a charge pump. Some embodiments may combine such conversion with all or part of the low pass filtering operation, as one example offered without limitation, by the digital filtering behavior shown by the switching action of a charge pump directed by digital control signals generating an analog signal output.

In at least one embodiment, a ring oscillator 340 composed of a sequence of identical gates in a closed loop is used as the internal Voltage Controlled Oscillator (VCO) timing source for the PLL. The VCO frequency is varied by analog adjustment of at least one of: gate propagation delay, inter-gate rise and fall time, and gate switching threshold within the ring oscillator. This may be implemented via switched capacitor banks, where a digital control signal is applied to selective place capacitive elements in parallel and/or series combinations to alter an RC time constant, as one non-limiting example. Still further, a current source that drives a gate of the ring oscillator may be increased or decreased to alter the output switching rise-time/fall-time, and thereby adjust the effective delay. Outputs taken at equal intervals (i.e. separated by equal numbers of ring oscillator gates) along the sequence of gates comprising the ring oscillator provide the four data phase sampling clocks, herein identified as the 0, 90, 180, and 270 degree clocks.

In one embodiment, the ring oscillator is composed of eight identical sets of logic gates (e.g., a set of inverter circuits), thus the phase difference from one such set to the next is 45 degrees. In this embodiment, the 0, 90, 180, and 270 degree outputs may be obtained, as examples, from the second, fourth, sixth, and eighth outputs. As many variations of such designs are known in the art, neither the number of elements in the ring oscillator nor the specific taps at which particular outputs are made should be construed as implying a limitation. As one example, the location of the 0 degree tap is arbitrary, as one familiar with the art will recognize that normal PLL behavior will phase align the ring oscillator with the external phase reference regardless of its initial phase. Similarly, equivalent designs may be obtained in which the output clock phases do not have square wave duty cycles; as one example being produced by the action of AND or OR gates with inputs from different tap locations. In the example receiver, it is desired that the VCO operate at a multiple of the received reference clock frequency, thus Frequency Divider 350 divides the VCO outputs by a comparable amount prior to the phase comparator. In one embodiment, binary (factor of two) dividers are used at 350 to obtain the correct sampling clock rate. In another embodiment, no divider is used, and the VCO outputs are presented to the phase interpolator directly.

Each of the four phases of sampling clocks is appropriately timed to sample received data for one of the four parallel processing phases. In particular, internal clock ph000 is aligned to optimally trigger data samplers in the phase0 phase of processing, clock ph090 in phase1, clock ph180 in phase2, and clock ph270 in phase3.

To allow the overall phase of the locked PLL signals to be offset from the reference clock input phase, the local clock output presented to the phase comparator is obtained from phase interpolator 360, the output phase of which is controllably intermediate between its input clock phases. Thus, the PLL may lock with its fixed phase relationship, while the internal clock signals obtained from ring oscillator 340 will be offset from that fixed phase by the phase delay amount introduced by phase interpolator 350, as controlled by signal Phase offset correction. Phase interpolators are known in the art, examples being provided by [Buchwald I] and [Tajalli II].

In one embodiment, phase interpolator 360 receives multiple local clock phases from the ring oscillator 340 having 90 degree phase differences. Said phase interpolator may be controlled to select two adjacent clock input phases and then to interpolate between them so as to produce an output at a chosen phase offset between the two selected values. For purposes of description, it may be assumed that a phase comparator design is used which drives the PLL to lock with a zero phase differential between the two phase comparator inputs. Thus, continuing the example, applying the 0 and 90 degree clock phases as inputs to the phase interpolator allows adjustment such that the PLL leads the reference clock input by between 0 and 90 degrees.

It will be apparent that equivalent results with comparable phase offsets may be obtained using other pairs of degree clocks and/or other phase comparator designs, which as previously described may lock with different phase differentials than that of the present example. Thus, neither the particular phase clocks chosen nor the particular phase comparator design described herein are limiting.

Phase Comparator with Interpolator

Figure 5:
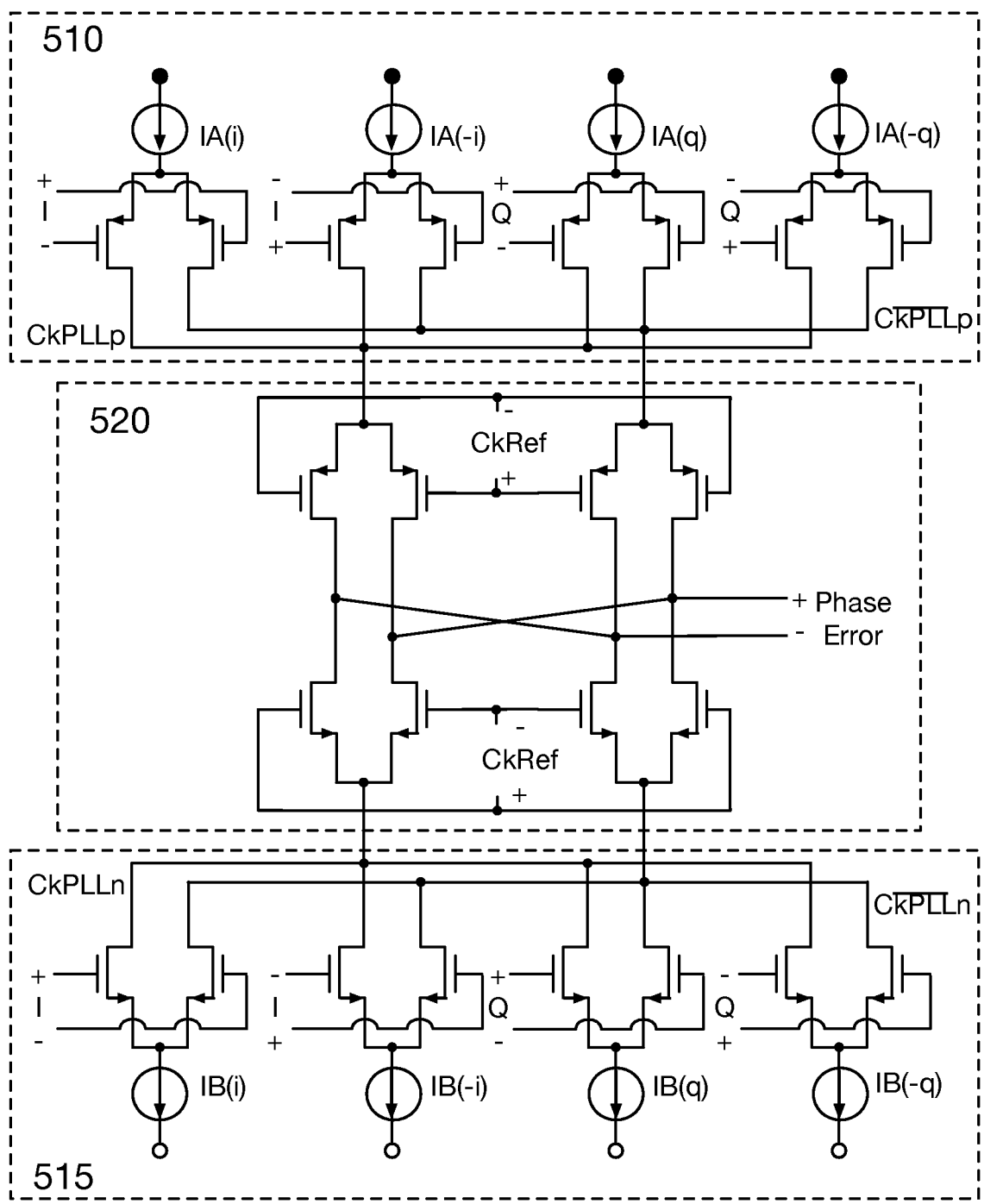
FIG. 5 is a schematic diagram of one embodiment integrating an XOR phase comparator and clock phase interpolator.

As communication channel data rates increase, it becomes increasingly difficult to maintain acceptable PLL lock range and accuracy, as inherent and parasitic circuit node capacitances introduce circuit delays and constrain the effective loop response bandwidth. An embodiment providing improved response characteristics suitable for such high-speed operation is illustrated in FIG. 5. As one familiar with the art will observe, this is a CMOS design providing symmetrical operation for both positive and negative output excursions, integrating elements of both phase interpolator and phase comparator designs. This tight integration results in reduced node capacitances, facilitating the desirable high speed operation, and the balanced differential structure simplifies the control of charge and discharge currents.

As with conventional designs, the PLL VCO (or a clock divider driven by said VCO) provides the local oscillator inputs to phase interpolator elements 510 and 515, which together set the effective local clock phase. Four local oscillator phases with 90-degree offset are shown i.e. equivalent to two phases in quadrature relationship and their complimentary signals and thus identified as +I, +Q, and −I, −Q, permitting a full 360 degree or "four quadrant" phase adjustment. Other embodiments may utilize as few as two local oscillator phases, may use oscillator phases having other than 90-degree phase differences, or may select clock phases from an input set of more than four; as one non-limiting example, choosing at least two clock phases to be interpolated between from an input set of eight clock phases.

In a first embodiment, phase interpolator element 510 includes four mixing elements, each mixing element comprising a differential transistor pair and a controlled current source, with a common differential output driven by the four mixing elements in parallel. Thus, configuration of current source IA(i) controls the amount of local oscillator phase +I presented to the common output ckp; similarly, current source IA(−i) controls the amount of complimentary output phase −I in the output, IA(q) controls the amount of +Q, and IA(−q) controls the amount of −Q. It will be readily apparent to one familiar with the art that configuration of the four current sources can produce an output clock at Ckp having any desired phase relationship to the PLL local clock input.

Similarly, phase interpolator element 515 current sources IB(i), IB(−i), IB(q), and IB(−q) may be configured to obtain an output clock at Ckn having any desired phase relationship to the PLL local clock input. In some embodiments, CkPLLp and CkPLLn may be configured to have complimentary relationships to provide phase comparator 520 with balanced and complimentary positive- and negative-going current amplitudes. However, configuration with non-complimentary IA and IB values may be performed to obtain particular results. As one example offered without limitation, an embodiment separately adjusting IA and IB values might obtain higher resolution phase adjustment, compared to an embodiment maintaining perfectly complimentary IA and IB values.

The second input to the phase comparator 520 is external reference clock CkRef+/CkRef−, producing the phase error output currents VCOct1+/VCOct1−. In one advanced embodiment, the two external reference clocks are of opposing polarity but not necessarily complementary phase, thus the positive polarity comparison and negative polarity comparison represent different phase comparisons. Such an advanced embodiment may be combined with non-complimentary IA and IB bias configurations, providing independent adjustment of local clock phase during those different phase comparisons. That is, in one embodiment, the CkRef input at the top of PD 520 is a first phase selected from the reference clock phases available in the circuit, and the IA currents are adjusted to provide a corresponding interpolated phase offset from the first selected phase, and the CkRef input at the bottom of PD 520 is a second phase selected from the reference clock phases available in the circuit, and the IB currents are adjusted to provide a corresponding interpolated phase offset from the second selected phase, wherein the amount of the relative phase offsets are the same.

Configuration of phase interpolator current source values may be performed by external control logic, including without limitation, a hardware configuration register, control processor output register, and hardware CDR adjustment logic.

Alternative Phase Comparator Embodiments

Figure 12A:
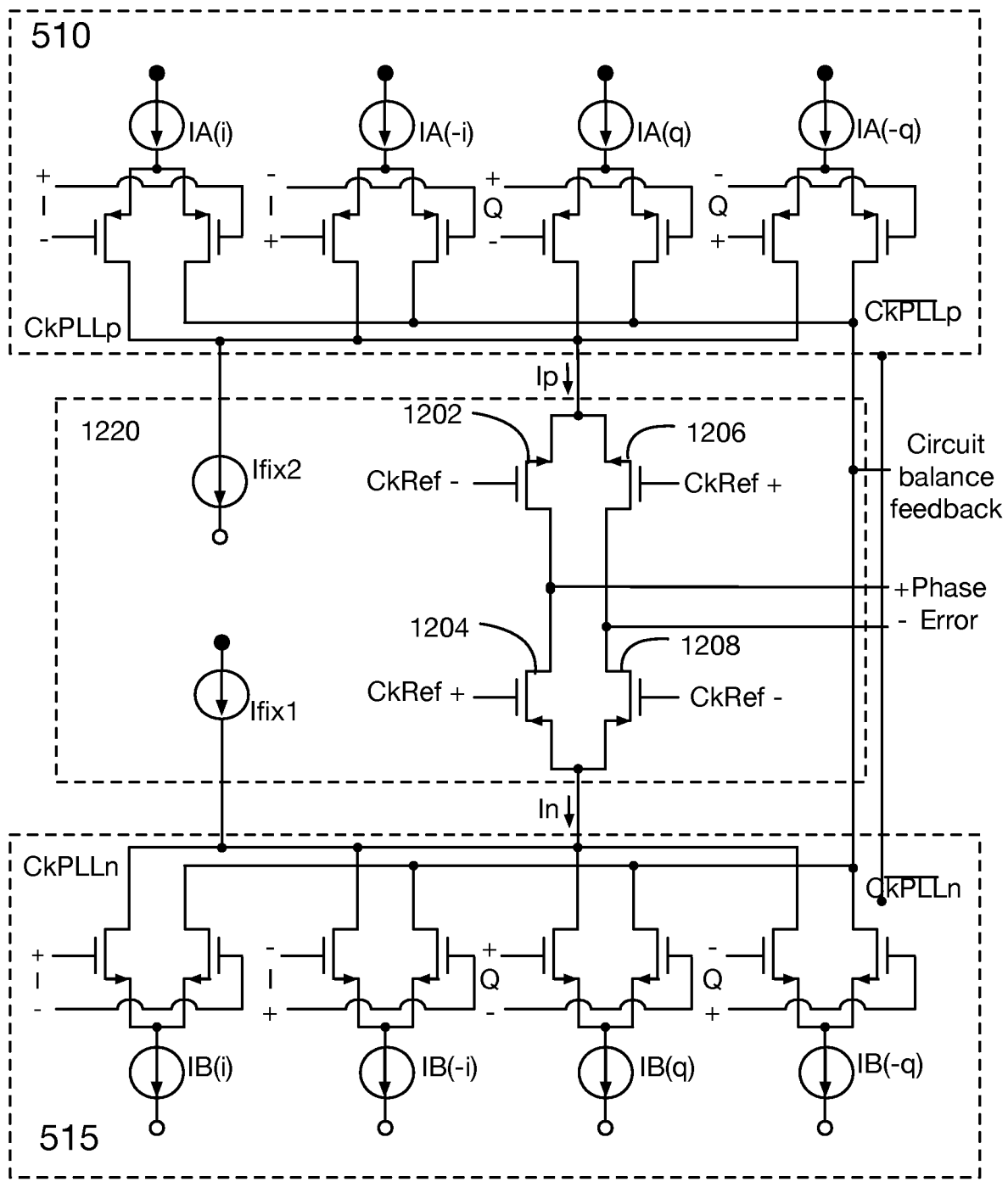
FIGS. 12A and 12B are block diagrams of an alternate embodiment of the integrated phase comparator and phase interpolator of FIG. 5.

Phase comparator 520 in the embodiment of FIG. 5 is shown as an XOR-style device as in FIG. 4A, mixing local clock CkPLL and external reference clock CkRef to produce phase error output VCOct1. In the alternative embodiment of FIG. 12A, a folded phase comparator is used at 1220, driven by currents produced by the combination of phase interpolator 510 and current sink Ifix2, and the combination of phase interpolator 520 and current source Ifix1. The folded phase comparator embodiment shown in FIG. 12A is described in further detail below. As with the previously-described embodiment, current sources IA(i), IA(−i), IA(q), and IA(−q) are configured to produce the desired interpolation of PLL clocks i, −i, q, and −q in interpolator outputs CkPLLp and $\overline{\text{CkPLLp}}$, while current sources IB(i), IB(−i), IB(q), and IB(−q) are configured to produce the desired interpolation of PLL clocks i, −i, q, and −q in interpolator outputs CkPLLn and $\overline{\text{CkPLLn}}$.

Phase comparator 1220 is also driven by received reference clocks CkRef+ and CkRef−, producing phase comparison results Phase Error (+) and Phase Error (−). In some embodiments, the circuit node labeled Circuit Balance Feedback may be monitored to determine the relative DC component of the interpolated clock signals, which may then be modified by adjustment of the configured current source values in 510 and 515. In some embodiments, each current source IA and IB receives seven control bits. It should be noted that embodiments are not limited to receiving seven control bits, and that any number of control bits may be implemented according to design constraints for PI resolution, for example. In some embodiments, current sources IA and IB are equal (e.g., IA=IB for +/−i, q). In such embodiments, the PIs 510 and 515 have 7 bits of resolution. In alternative embodiments, additional resolution may be implemented by introducing a shift in IB with respect to IA, or vice versa. In an exemplary embodiment, IA=IB+8, where 8 is a decimal shift added to the control bits of each current source IA to obtain the control bits of each current source IB. In such embodiments, the P-side PI 510 and N-side PI 515 are receiving two different VCO phases, and the phase comparator collects information from different phases of the VCO. Since the PIs 510 and 515 combine information from different phases of VCO, the PLL has more detailed information about phases of PLL and the bandwidth of the PLL is higher than a conventional PLL.

Embodiments for which IA=IB+shift are a special case of a matrix phase comparator in which there are two partial phase comparators. The first partial phase comparator (N-side XOR) compares the phase of reference with one set of VCO feedback phases, and a second partial phase comparator (P-side XOR) that compares the reference clock phase with a second set of VCO feedback phases. Matrix phase comparator embodiments are described in further detail below.

Figure 13B:
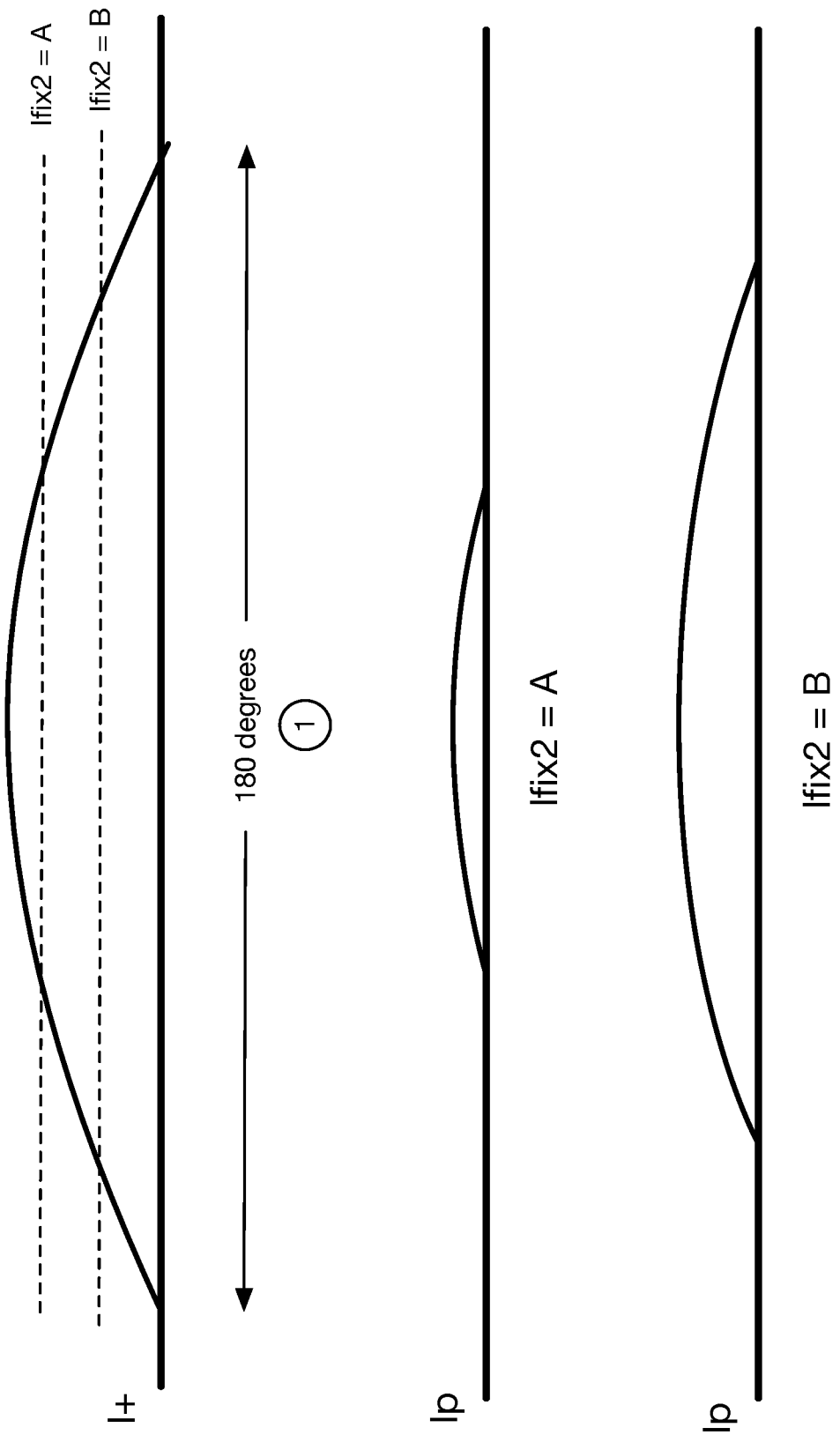
FIG. 13B is timing diagram illustrating a reverse clipping effect, in accordance with some embodiments.

In some embodiments, a folded structure as shown in FIG. 12A may be used. FIG. 12A is similar to the embodiment shown in FIG. 5, however the phase comparator 520 is replaced with a folded phase comparator 1220. As shown, folded phase comparator 1220 includes current sources Ifix1 and Ifix2, which may be configured to provide more voltage headroom to the PMOS PI current sources IA and the NMOS PI current sources IB. Further, phase comparator 1220 includes a pair of transistor branches connected to CkPLLp and CkPLLn. For purposes of illustration, consider PI 510 and 515 only having IA(i) and IB(i) turned on respectively, representing phase ph0000 from the VCO. In the case where CkRef is offset 90 degrees from ph0000, the folded phase comparator 1220 will be in lock condition. As shown in FIG. 13A, during the first 180 degrees (1) of a period, for a first 90 degrees (2), current Ip is charged to the (−) terminal of the Phase Error signal through transistor 1206 using PMOS PI 510. At the same time, current In is discharged from the (−) terminal of the Phase Error signal through transistor 1208 using NMOS PI 515. Similarly, during the second 90 degrees (3), current Ip is charged from the (+) terminal of the Phase error signal through transistor 1202, while current In is discharged from the (+) terminal through transistor 1204. As shown, Ifix2 will sink a fixed amount of current being provided from PMOS PI 510, while Ifix 1 sources some current to NMOS PI 515 to prevent the current sources in the NMOS PI from sinking too much current from the Phase Error signal. Such a technique provides a reverse clipping effect. One of skill in the art may notice that equally adjusting the Ifix current magnitudes may have an effect on the range of the Phase Error signal. In some embodiments, increasing the Ifix magnitudes will lower the magnitude range of the Phase Error signal, while decreasing the Ifix magnitudes will increase the magnitude range of the Phase Error signal. This relationship is illustrated by FIG. 13B.

FIG. 13B is a timing diagram illustrating the reverse clipping feature described above. FIG. 13B depicts the magnitude of current Ip in the first 180 degrees (1) for two values of Ifix2: A and B, where A>B. As shown, the magnitude of Ip is less in the case of Ifix2=A. When Ifix2=B, the magnitude range of Ip is relatively higher. One of skill in the art would notice a similar effect occurs in the case of In being discharged from the folded phase comparator 1220.

Figure 12B:
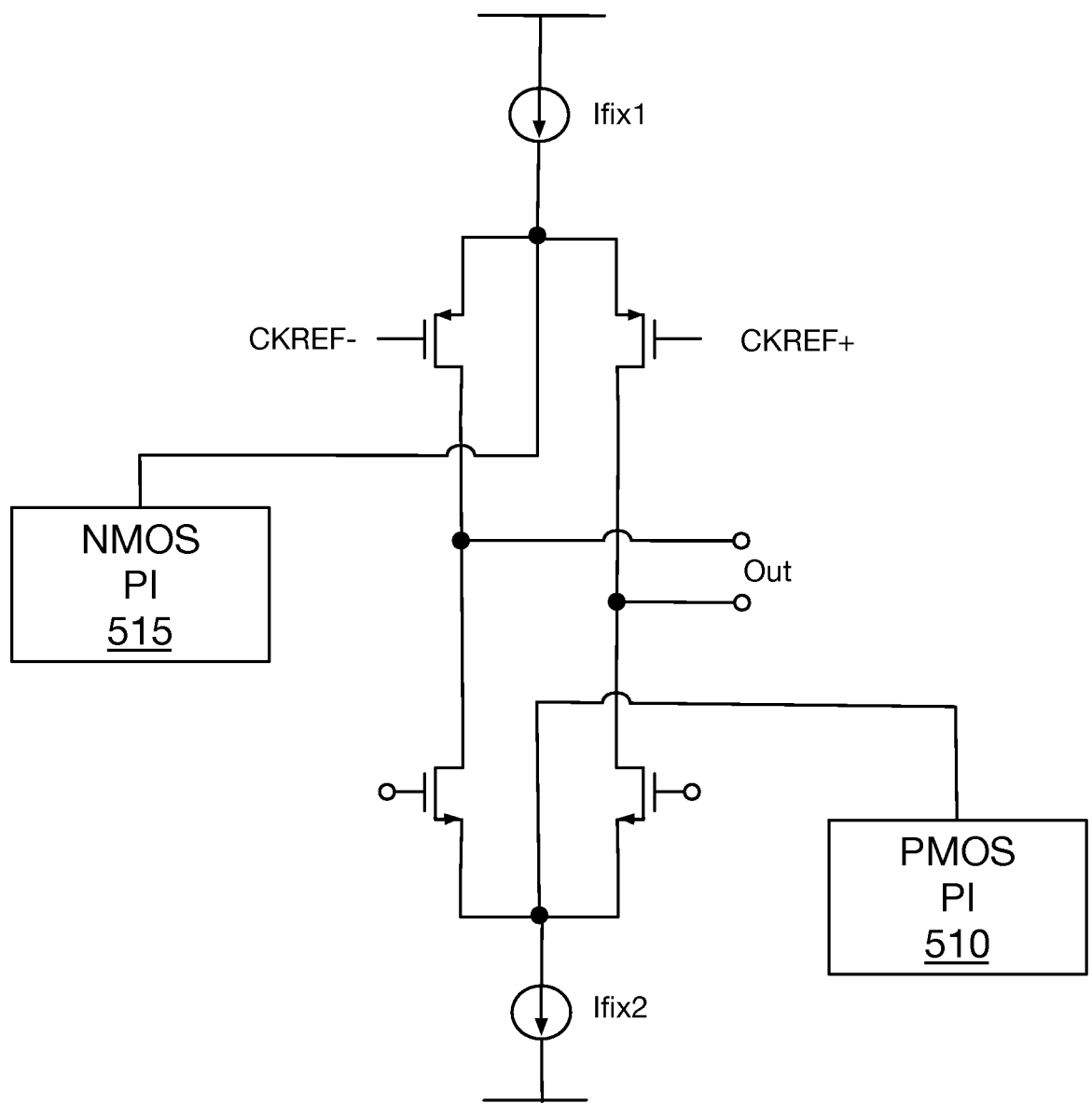

In some embodiments, the second 180 degrees (4) may be used to provide circuit balance feedback, as shown in FIG. 12A. During the circuit balance feedback phase (4), current may be charged via the PMOS PI 510 while current is discharged via the NMOS PI 515. If there is an imbalance of charge/discharge currents, a non-zero circuit balance feedback signal may indicate this imbalance, which may occur due to transistor mismatches, for example. The circuit balance feedback signal may then be used to adjust either Ifix1 or Ifix2 to balance the charge/discharge currents so that the balance feedback signal is zero. In some embodiments, the voltages of the charge-pump circuit may be monitored, and if equal, the circuit is properly balanced, i.e., Ip=In. A simplified schematic of the phase comparator circuit of FIG. 12A is shown in FIG. 12B.

The phase comparator of [Tajalli IV] may alternatively be used at 520 or 1220, providing equivalent phase detection with enhanced signal headroom in embodiments utilizing low power supply voltages. Other phase comparators, including all variations shown in FIGS. 4A, 4B, and 4C, may also be substituted at 520 in that embodiment.

As one example of such alternative embodiment, the State Machine Phase/Frequency Detector of FIG. 4B may be combined with the Phase Interpolator design of FIG. 5.

Figure 6A:
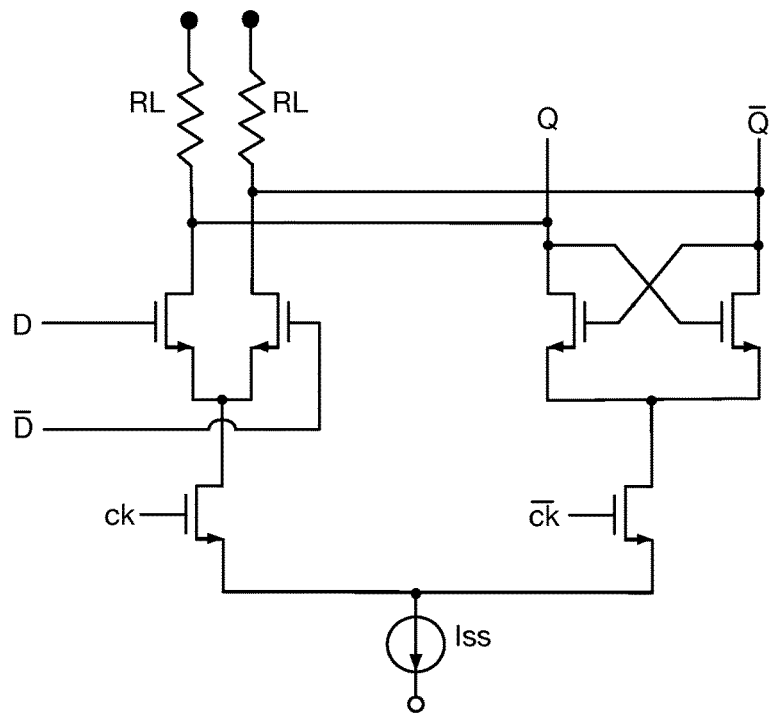
FIG. 6A is a schematic diagram of a clocked data latch and FIG. 6B is a schematic diagram of a further embodiment of a clocked data latch integrating a clock phase interpolator.
Figure 6B:
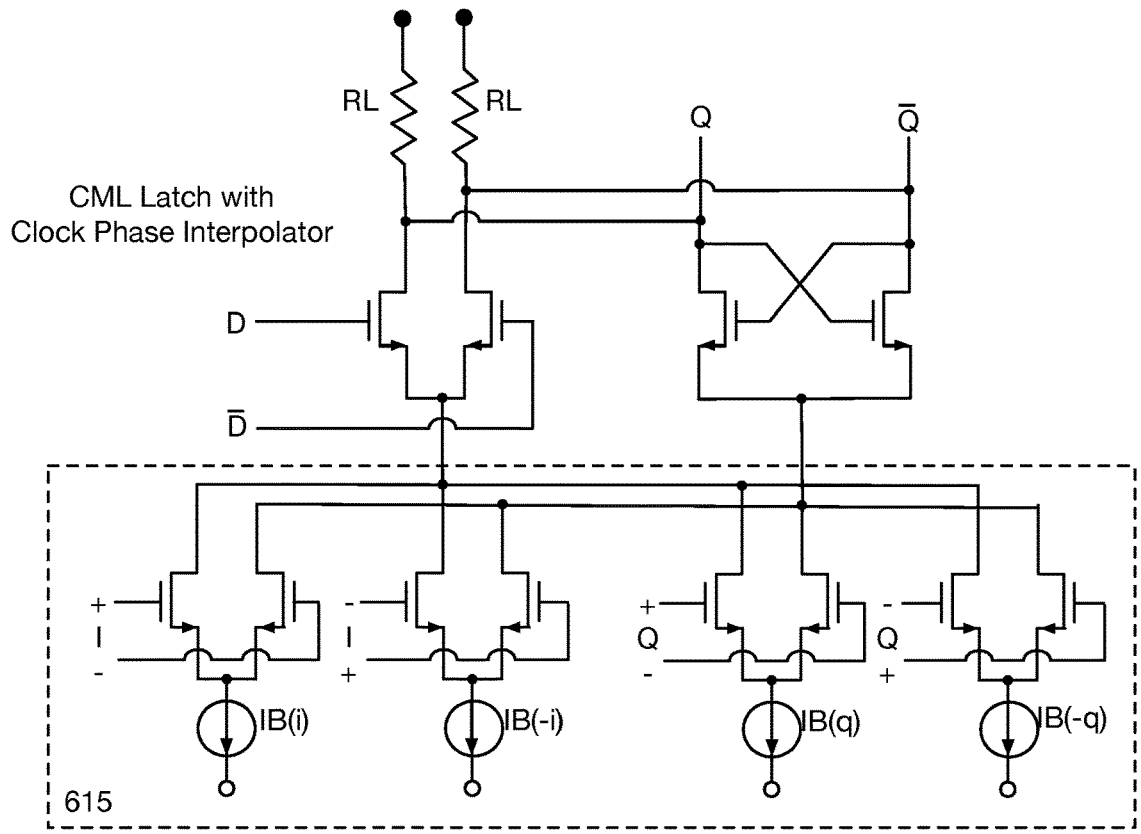

FIG. 6A shows a schematic of one embodiment of a conventional CML clocked latch, composed of a clocked feedback latch outputting results Q and Q the state of which is initialized by clocked differential inputs D and D. FIG. 6B shows the same circuit in which the clock source phase is modified by phase interpolator 615, operation of which is as previously described for FIG. 5.

Figure 7A:
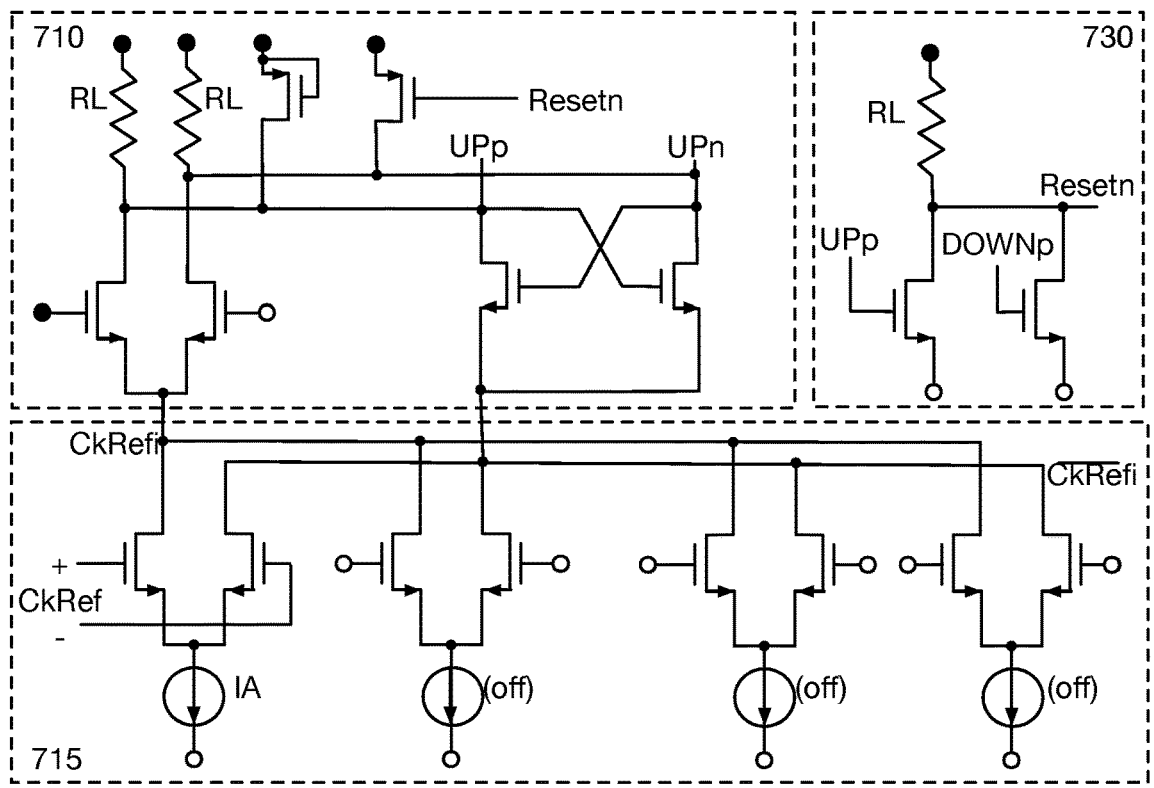
FIGS. 7A and 7B are schematic diagrams of an embodiment integrating a state machine phase comparator and clock phase interpolators.
Figure 7B:
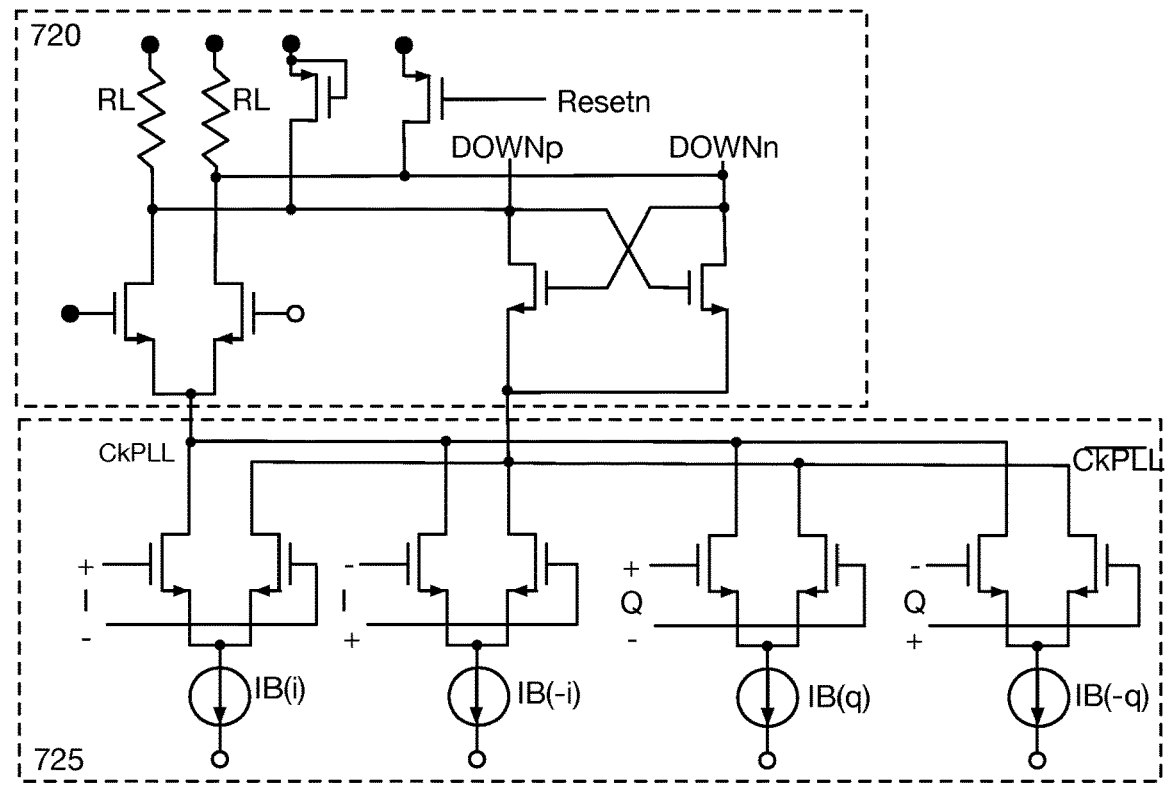

Substituting the clocked latch circuit of FIG. 6B into each D flip-flop instance of FIG. 4B produces the alternative embodiment shown in FIGS. 7A and 7B. D flip-flop 710 is clocked by the received clock CkRef, which is passed through phase interpolator 715. As an example and for purposes of explanation, without a configured phase offset (or a desired offset of 0 degrees), current source IA would be set to "mix" input CkRef at 100% proportion, and the other three current sources set to zero current. D flip-flop 720 is clocked by local clock CkPLL, which is obtained by configuration of phase interpolator 725 current sources IB(i), IB(−i), IB(q), and IB(−q), which in turn controls the relative proportions and polarities of I and Q clocks being combined. In one embodiment, I is obtained from ph000, −I from ph180, Q from ph090, and −Q from ph270, as seen in FIG. 3. A simple CML OR gate 730 drives the reset function for flip-flops 710 and 720.

It should be noted that in this one embodiment the majority of phase interpolator 715 is functionally disabled and retained only to preserve the same parasitic load characteristics as are presented by active phase interpolator 725, to maximize circuit symmetry and maintain balanced loading characteristics to minimize secondary effects such as detection bias and drift.

Integrated Phase Comparator, Interpolation, and Charge Pump

As previously described, PLL phase comparator outputs are typically used to drive a charge pump circuit (CPC), the output of which is an analog error signal used to control the VCO. The described improvement from reduced capacitance and resulting higher circuit speed in integrating the PLL phase comparator and clock adjustment phase interpolator may be further extended by also integrating elements of the charge pump in the same manner.

Figure 8:
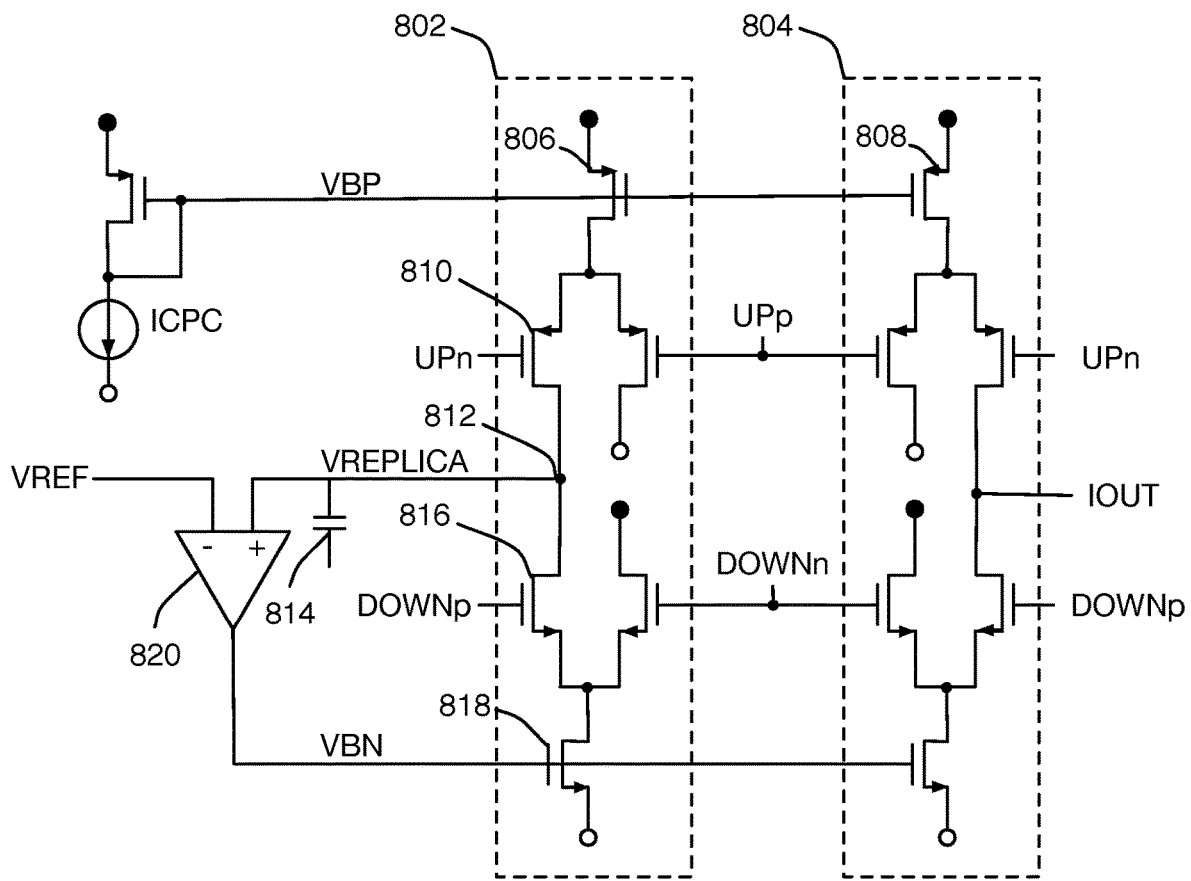
FIG. 8 is a schematic diagram of one embodiment of a charge pump suitable for further integration with a phase comparator embodiment.

In this combined embodiment, the charge pump control signals UPp, UPn, DOWNp, and DOWNn provided by the embodiment shown in FIGS. 7A and 7B directly control the charge pump embodiment of FIG. 8 to produce output $I_{OUT}$. Current source $I_{CPC}$ and voltage reference $V_{REF}$ may be configured to scale and adjust the $I_{OUT}$ range. One familiar with the art will note the significant symmetry in the circuit of FIG. 8, allowing accurate tracking between generation of $V_{REPLICA}$ and $I_{OUT}$ signals.

FIG. 8 is a schematic of a charge pump circuit with improved charge/discharge current balancing, in accordance with some embodiments. The circuit 800 includes two parallel charge pumps 802, 804: the two differential pairs within charge pump 804 generate an output current representing a phase error signal in response to the up and down pulses, and the two differential pairs of charge pump 802 are used to set the discharge current to be equal to the charge current as described below. Specifically, the current source $I_{CPC}$ sets a charging current level by providing a corresponding bias voltage $V_{BP}$ through a current mirroring circuit to drive the top current sources 806, 808 of the two charge pumps so as to also provide $I_{CPC}$ to each charge pump 802, 804. When UPn goes low and turns on field effect transistor (FET) 810, the node 812 is charged (capacitive element 814 is either a discrete cap or a parasitic cap) by the charging current $I_{CPC}$ provided by FETs 806, 810. In a balanced condition (i.e., in the absence of a phase error), the amount of current that is then discharged during a high DOWNp signal through the bottom FET 816 should bring the node 812 back to the $V_{REF}$ value. If the discharge current is too low and the voltage $V_{REPLICA}$ increases above $V_{REF}$, then the amplifier 820 will increase the bias voltage $V_{BN}$ to the discharge-current FET 818 to increase the amount of discharge current so that it equals the charge current $I_{CPC}$ and the voltage $V_{REPLICA}$ at node 812 is brought back to $V_{REF}$. On the other hand, if the discharge current set by $V_{BN}$ on FET 818 is too high, the $V_{REPLICA}$ voltage drops too low, and the amplifier 820 responsively reduces the bias voltage $V_{BN}$ on discharge-FET 818 to bring the charge pump currents into equilibrium.

Other embodiments may be obtained by equivalent combination of phase comparator, phase interpolator, and charge pump elements.

Oversampling of Input Reference Signal

The asymmetric use of the phase interpolators in, as one example, FIGS. 7A and 7B, stems from the different nature of the local clock and reference clock sources. The former is obtained from a multiphase clock source (e.g. an oscillator or divider) inherently capable of providing the multiphase inputs for use by a phase interpolation element. The latter is generally single phased, obtained from (typically) one received clock source.

In the known art, [Tan] described a combined DLL/PLL structure, in which the voltage controlled delay line incorporated in the PLL VCO is duplicated as an input delay line acting on the reference clock input, and controlled by a single feedback error signal. [Ng] and [Chang] also describe use of a front-end DLL to serve as a frequency multiplier to facilitate generation of very high frequency clocks.

However, if such a controlled delay line is tapped, and so configured that the differential delay between taps is proportional to the time between received clock edges, a received clock passing through such a delay line produces a resulting set of outputs which take on some of the characteristics of a multiphase clock. As one example offered without limitation, the equal-interval outputs of a four-tap delay line having an overall delay comparable to the reference clock period will provide outputs having similar characteristic to quadrature phased clock signals. Continuing this example, if each such output is phase compared to an appropriately-selected local clock phase, a series of phase error results will be produced which may be combined to produce a more accurate aggregate clock error signal for the PLL VCO. The delayed versions of the receive clock represent additional opportunities for phase comparison with a clock derived from the VCO, thus providing a higher update rate for the controlled loop, and thus improved PLL loop bandwidth leading to reduced jitter and better noise immunity. That is, using this technique, the update rate of the loop will be increased, which in turn enables the circuit to track and correct the effects of noise and jitter at higher frequencies.

For the delayed phase comparisons to provide meaningful information to the PLL, the delay intervals provided by the delay line must be coordinated with the period between local clock phases, with such controls giving the delay element many of the aspects of a Delay-Locked Loop (DLL.) As seen in the block diagram of FIG. 9, the external clock reference input to the previous PLL embodiment 300 is provided by DLL 910. The received clock signal R5 is presented to tapped delay line 916, producing a series of received clock phases 918. The DLL control loop is provided by phase comparator 912 comparing the received clock with a delayed clock, producing an error value that is low pass filtered 915, producing a delay adjust signal controlling the delay line timing.

Within PLL 300, the previous simple phase comparison (320 of FIG. 3) is now performed by multi-phase comparator 920. In at least one embodiment, XOR gates compare the phase of each received reference clock signal on the N lines (e.g., N=2, 4, 8, etc., and possibly including odd integers as well to obtain other phases such as 60, 120, 180, 240, 300) 918 with a different clock phase from the N phases of the local clock signal on lines 965 from phase interpolator 360. Each XOR gate output representing a partial phase error signal may be converted to an analog signal value, all such analog partial phase error signals being summed using a summation circuit 935 to produce a composite phase error signal for controlling ring oscillator 340, as previously described. In a further embodiment, summation 935 is performed by a weighted summation node comparable to the previously-described MIC mixer, the different selected weights of said summation allowing further control of PLL static and dynamic operational characteristics. Alternatively, each XOR output may be used to drive a separate transistor circuit for injecting or removing charge from a capacitive element to achieve the summation. In addition, the PLL 340 of FIG. 9 may be configured to provide a desired phase offset, where the interpolated phases each have the same offset relative the tap delay line signal to which it will be XOR compared.

In some system environments, the described multi-phase reference clock may be directly available from the receiver, as one example where the communications protocol incorporates multiple clock signals.

Figure 10:
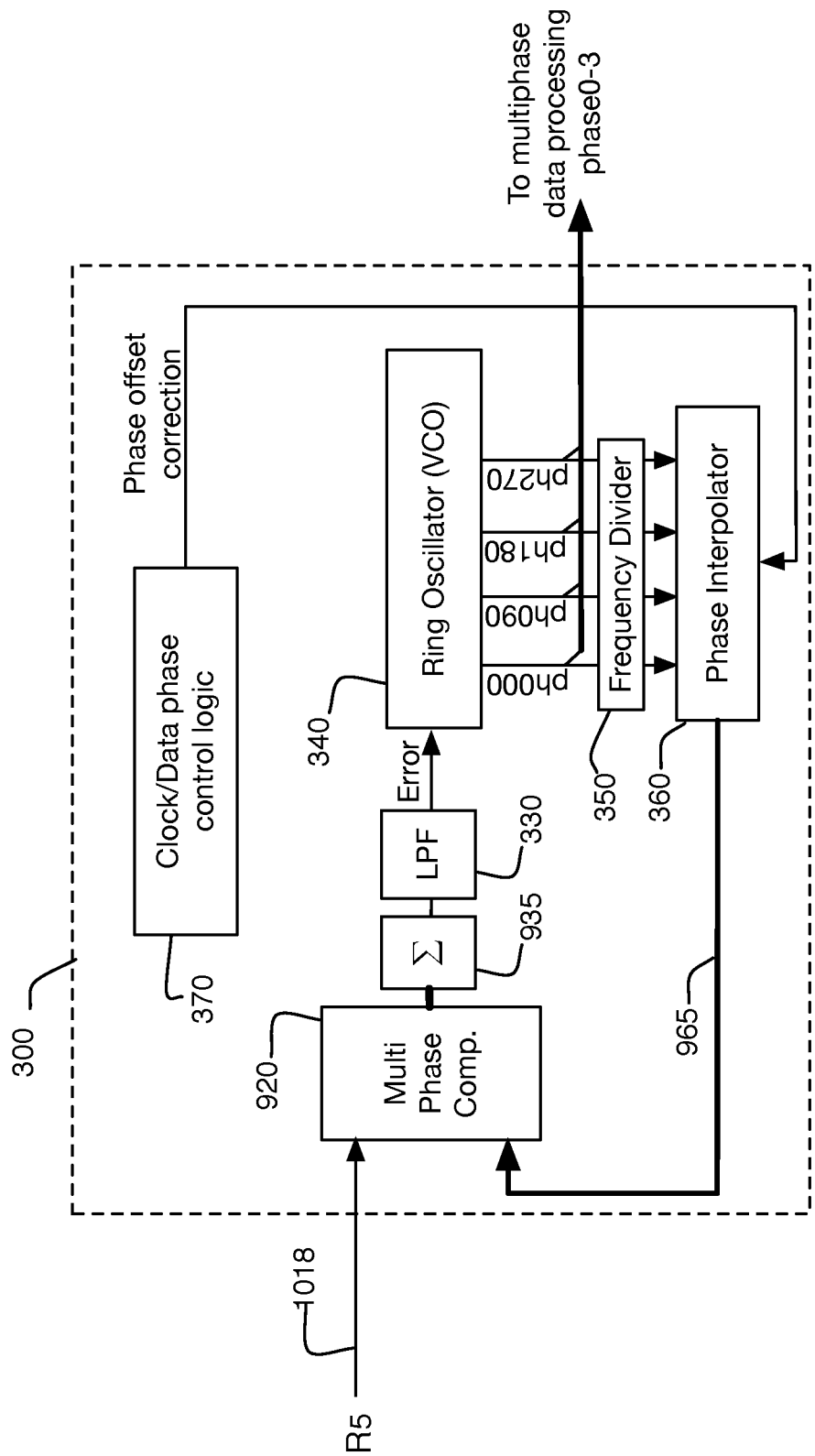
FIG. 10 is a block diagram of a further embodiment in which multiple comparisons are made between a single reference clock and multiple local clock phases.

The additional feedback information provided by the multiple comparison operations may also be obtained without the previously-described DLL front end. FIG. 10 shows an embodiment in which the single received reference signal 1018 enters multi-phase comparator 920 in which the single received reference signal is compared to each of two or more phases of local clock signal 965. In one embodiment, XOR partial phase comparators form partial phase error signals by comparing the phase of the single received reference clock phase 918 with a different phase of the local clock signal 965 from phase interpolator 360. Each partial phase error signal may be converted to an analog signal value, all such analog partial phase error signals being summed to produce a composite phase error signal for controlling ring oscillator 340, as previously described.

In a further embodiment, summation 935 is performed by a weighted summation node comparable to the previously described MIC mixer, the different selected weights of said summation allowing further control of PLL static and dynamic operational characteristics. In particular, such weight adjustments may be used to produce additional closed-loop poles and/or zeroes in the PLL time domain transfer function, providing additional control of loop stability.

Figure 14A:
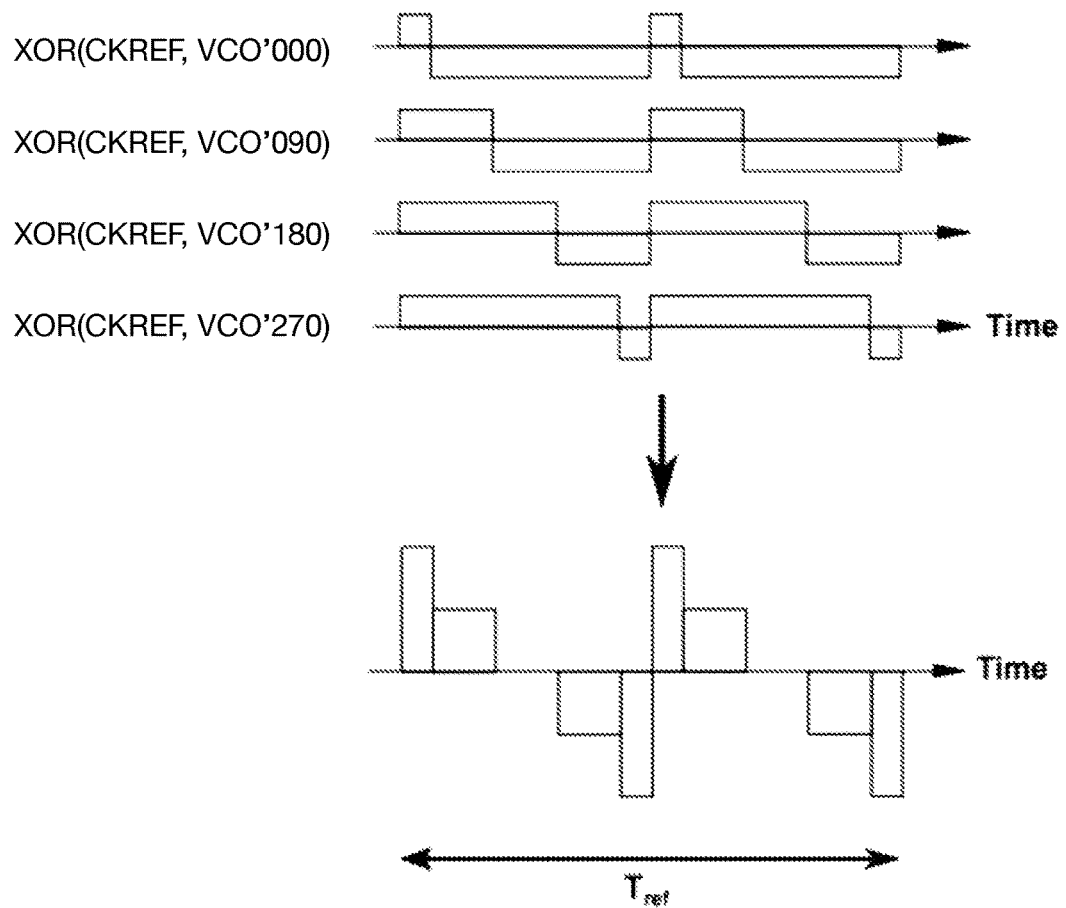
FIGS. 14A and 14B are timing diagrams for an array-XOR phase comparator and single-XOR phase comparator, respectively, in accordance with some embodiments.

FIG. 14A is a timing diagram of a reference signal CKREF being compared with four phases of the VCO (feedback from the PLL):
XOR(CKREF, VCO'000)
XOR(CKREF, VCO'090)
XOR(CKREF, VCO'180)
XOR(CKREF, VCO'270)

Figure 14B:
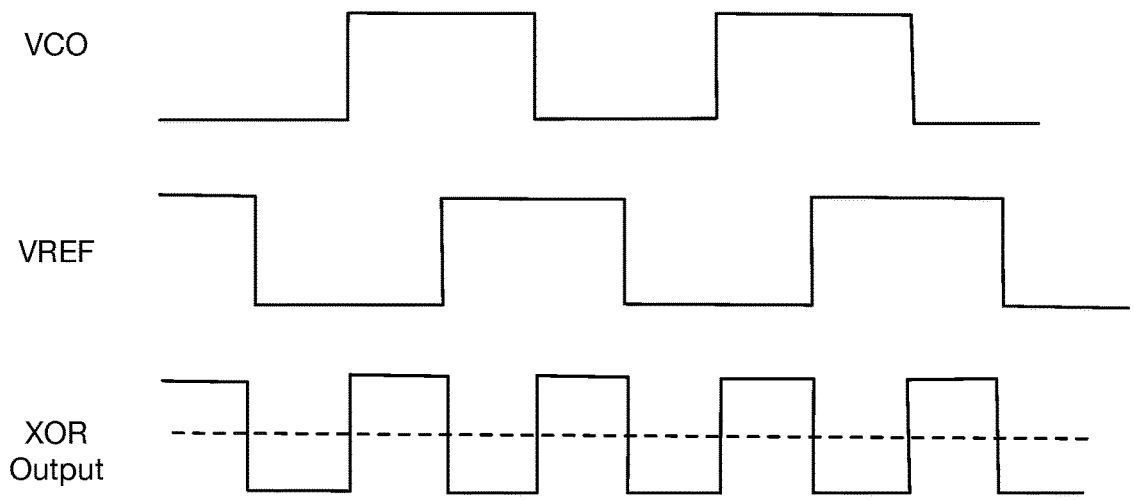

As shown in FIG. 14A, it is assumed all weights are equal, however this is purely for illustrative purposes, and should not be considered limiting in any way. FIG. 14A further includes a summation of the four XOR outputs. As can be seen, in lock condition, the integral of the bottom waveform is zero, and the PLL will lock properly. For convenience, FIG. 14B has been included to illustrate a conventional XOR based phase comparators in which the reference is compared to only one VCO phase. In lock position, the reference and VCO are 90-degree phase shifted, and the output of XOR is a rectangular waveform with an average value equal to zero. One may observe how the two waveforms (simple XOR in the FIG. 14B and array-XOR in FIG. 14A) differ from each other; however in both cases the average value for a given period is zero, and the PLL locks. In embodiments utilizing an array of partial phase comparators, a larger number of transitions occur with respect to a single XOR phase comparator. As each transition carries information about an edge, a larger number of transitions means that phase comparator has been able to collect more information from VCO and CKREF.

It should be noted that in array-XOR embodiments, some comparisons might be done using XNORs. As such, an XOR or XNOR for different phase comparisons may be selected carefully to ensure system stability.

In at least one embodiment, the weights of said summation are configured such that they decline in proportion to the timing difference of the comparison clock phase relative to the PLL "normal lock" phase. As one example offered without limitation, if ph090 is the normal lock phase of the PLL, the comparison of ph090 and the received reference signal is weighted 1; comparisons of ph000 and ph180 (e.g. one tap offset from the normal lock phase) are weighted ½; comparison of the received reference signal and ph270 (two tap offsets from the normal lock phase) is weighed 14; etc. These various weighted comparison results are then summed to produce a composite signal which when low pass filtered 330, is the Error value controlling PLL VCO 340.

In at least one embodiment utilizing multiple phase comparators, the deterministic jitter produced by the multiple phase comparisons was seen to occur at a 12.5 GHz rate with equal phase comparator weights. Even though the amount of jitter was very small and the jitter rate was well above the loop filter cutoff frequency, the deterministic jitter was significantly reduced with the described weight adjustments, in which weight magnitudes decline in proportion to their offset distance from the primary reference signal sample. In some embodiments, different weighted values are used in a comparator circuit to construct a discrete time domain filter. This property can be used to simplify the design of analog filter 330. For example, with proper weighting values one might construct a discrete time domain zero in the transfer function that provides conditions to make the loop robust.

As with previously described examples, other embodiments may be obtained by equivalent combination of phase comparator, phase interpolator, and charge pump elements.

Matrix Phase Comparisons

Figure 11A:
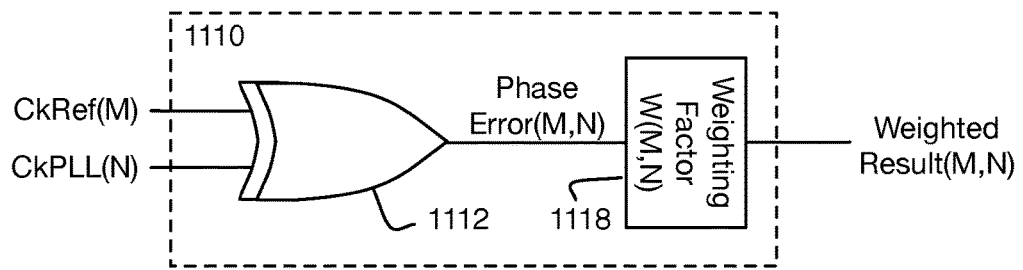
FIG. 11A is a weighted XOR phase comparator, in accordance with some embodiments.
Figure 11B:
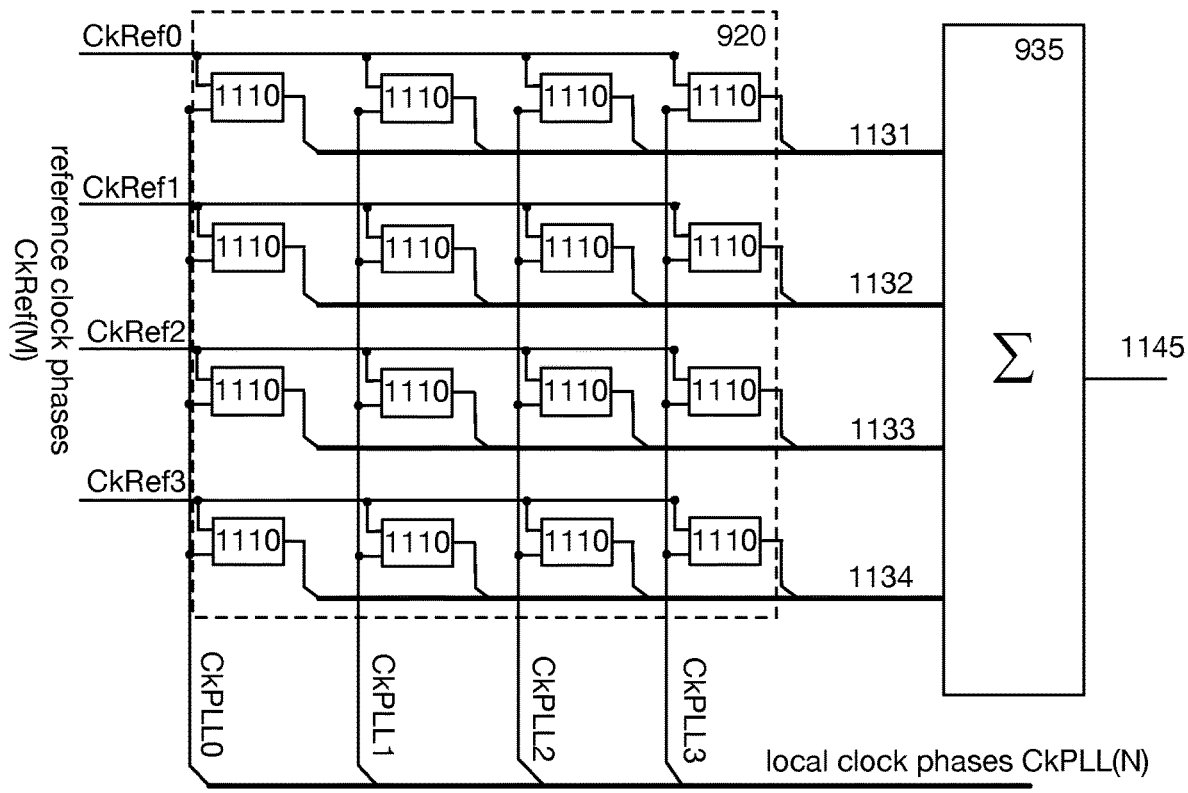
FIG. 11B is a block diagram of one embodiment of a matrix phase comparison of M reference phases and N local clock phases.

The multi-phase comparison of multiple phases derived from a received reference signal and multiple phases derived from the local PLL clock may be generalized into a matrix phase comparator, one embodiment of which is shown in FIG. 11B, with one embodiment of each individual phase comparator 1110 (which may be referred to in FIG. 11B as a partial phase comparator) in the matrix shown in FIG. 11A as single-phase comparator 1110. For descriptive purposes, partial phase comparators arranged in a four by four matrix are illustrated, with no limitation implied by those illustrative choices. Embodiments may be organized into rectangular, square, or sparse matrices of any dimensions M and N, with elements of the matrix being composed of any partial phase comparator described herein and optionally any weighting factor computation described herein. As used herein, a sparse matrix is any embodiment in which at least one of the described element weights is zero.

In a full matrix comparison, each of M phases derived from the received reference signal is separately phase compared with each of the N phases derived from the local clock, which may be received from a PLL, or alternatively directly from a VCO or various other clock sources. For purposes of illustration, the N phases of the local clock are received from the PLL. Each resulting phase error signal is weighted by a configured or predetermined amount, with all (M*N) weighted results summed to produce an aggregate error result. An example of one phase comparator is shown in FIG. 11A as 1110, composed of XOR phase comparator 1112 feeding to result weighting factor 1118.

An embodiment of the complete matrix phase comparator 1120 in FIG. 11B is composed of M*N instances of partial phase comparator 1110, each partial phase comparator accepting one of the M phases of the reference signal, herein identified as CkRef0, CkRef1, CkRef2, CkRef3, and one of the N phases of the local clock phase inputs herein identified as CkPLL0, CkPLL1, CkPLL2, CkPLL3, and producing a weighted result e.g. multiple partial phase error signals 1131, 1132, 1133, 1134 as input to summation 935, which produces a composite phase error signal 1145.

Figure 9:
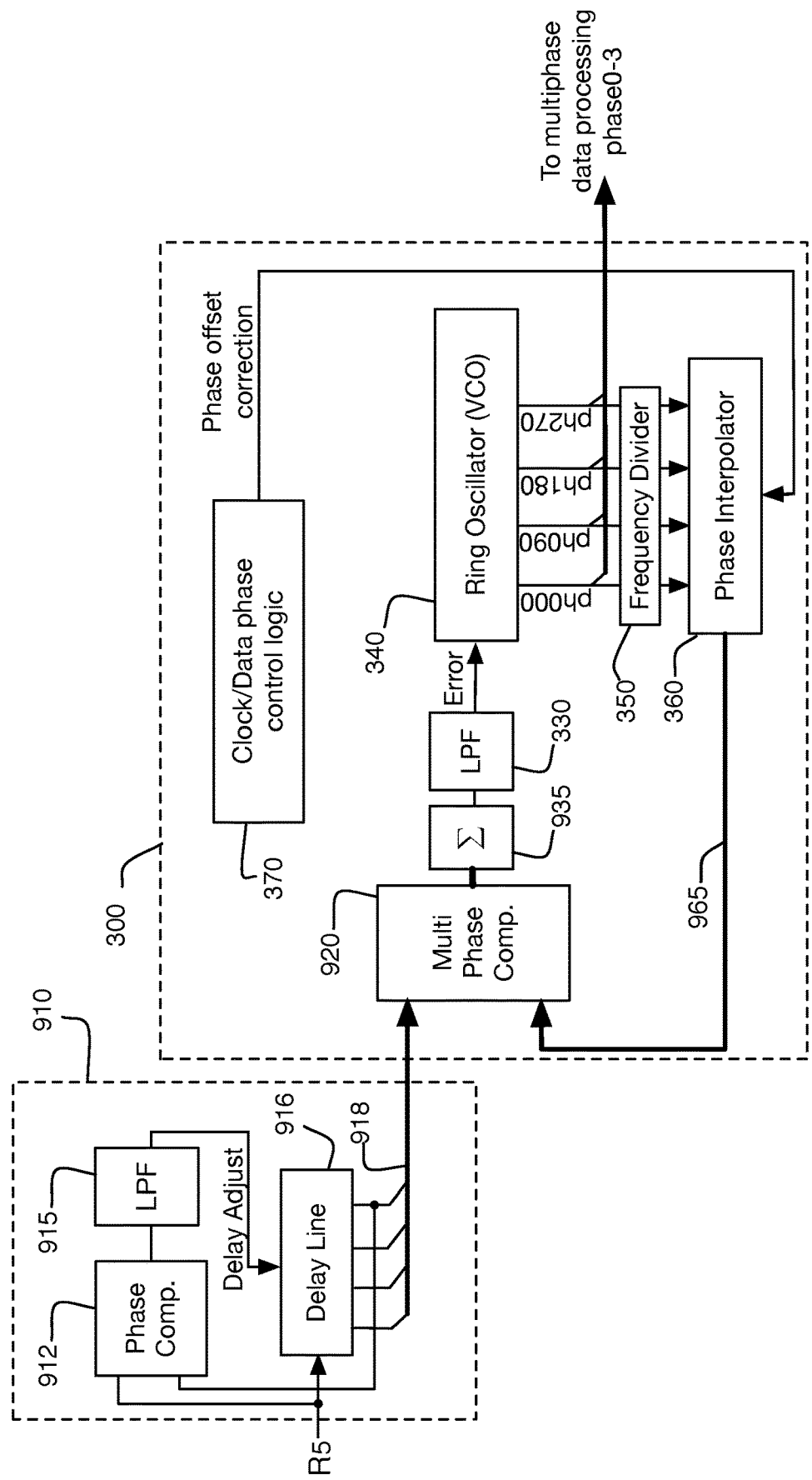
FIG. 9 is a block diagram of a further embodiment in which multiple phases of a reference clock are compared with multiple local clock phases.

One familiar with the art will observe that the previously-described multi-phase comparator 920 of FIG. 9 is equivalent to a partially-populated instance of the present matrix comparator, i.e. having comparators instantiated across a diagonal of the matrix. Functionally, an identical result may be obtained from a full matrix by setting the weights along such a diagonal to a nonzero value, and all other comparator weights to zero. It thus follows that other described behaviors including simulation of phase offsets, introduction of loop time domain zeroes, etc. may be similarly be obtained by selective configuration of matrix weighting factors.

Figure 15:
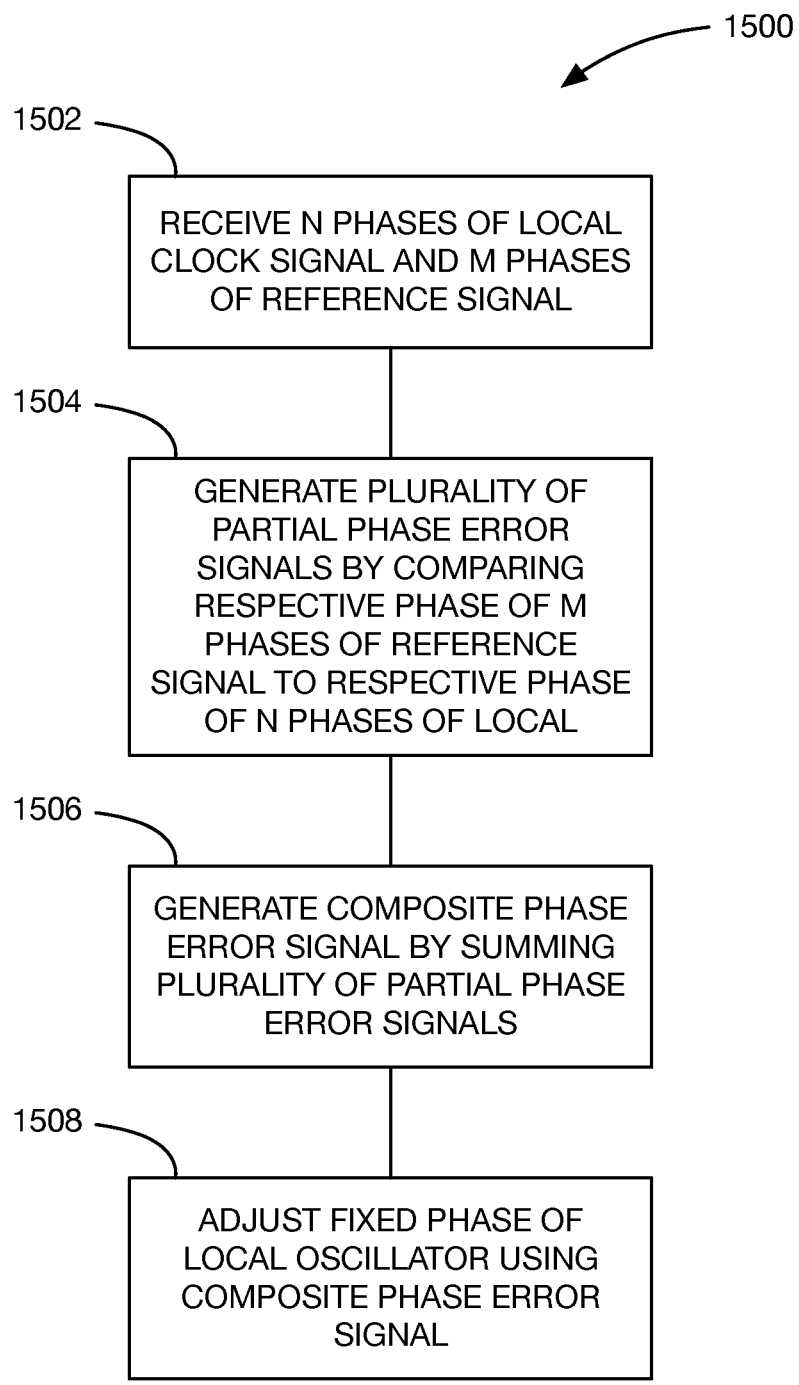
FIG. 15 is a flowchart of a method, in accordance with some embodiments.

FIG. 15 illustrates a flowchart of method 1500, in accordance with some embodiments. As shown, method 1500 includes receiving N phases of a local clock signal and M phases of a reference signal at block 1502, wherein M is an integer greater than or equal to 1 and N is an integer greater than or equal to 2. The method further includes generating a plurality of partial phase error signals at block 1504, each partial phase error signal formed at least in part by comparing (i) a respective phase of the M phases of the reference signal to (ii) a respective phase of the N phases of the local clock signal. At block 1506, a composite phase error signal is generated by summing the plurality of partial phase error signals, and responsively a fixed phase of a local oscillator is adjusted 1508 using the composite phase error signal.

In some embodiments, M=1, and N partial phase error signals are summed to generate the composite phase error signal. Alternatively, the plurality of partial phase error signals includes M=N partial phase error signals, and a given phase of the N phases of the local clock signal and a given phase of the M phases of the reference signal are each used to generate a single partial phase error signal. In further alternative embodiments, the plurality of partial phase error signals comprises M×N partial phase error signals, and each phase of the N phases of the local clock signal is compared to each phase of the M phases of the reference signal.

In some embodiments, each partial phase error signal of the plurality of partial phase error signals has a corresponding weight applied to it.

In some embodiments, the M phases of the reference signal are received from a delay-lock loop operating on an input reference signal.

In some embodiments, at least one of the N phases of the local clock signal is generated using a phase interpolator operating on local oscillator signals and a phase offset signal. In some embodiments, at least one of the N phases of the local clock signal comprises interpolating 4 phases using 4 differential pairs in the phase interpolator, each of the 4 phases being interpolated according to a corresponding differential pair connected to an independently tunable current source.

In some embodiments, at least one partial phase error signal is generated using a pair of flip-flops, wherein a first flip-flop of the pair of flip-flops is clocked using a given phase of the M phases of the reference signal and a second flip-flop is clocked using a given phase of the N phases of the local clock signal.

In some embodiments, each partial phase error signal is an analog signal generated using a respective charge pump, the respective charge pump receiving respective charge pump control signals generated by a respective comparison between the respective phase of the M phases of the reference signal and the respective phase of the N phases of the local clock signal.

Alternative Embodiments

The clock signal received from MIC5 in FIG. 2 after being transported over two dedicated clock wires could just as easily be received from, as one example MIC4, having been transported as one subchannel of the vector signaling code also carrying the data. This method of embedding the clock in a vector signaling code subchannel is described in [Shokrollahi II] and [Holden III]. All of the described clock embedding embodiments therein may be beneficially combined with the PLL and timing control mechanisms described herein, without limitation.

Similarly, known methods of communicating a clock signal using edge transitions of the data lines may be combined with the PLL and timing control mechanisms described herein. In particular, vector signaling codes with guaranteed transition density over time, such as taught by [Shokrollahi I] are amenable to such combination.

I claim:

1. A method comprising:
   obtaining at least one phase of a reference signal and at least three phases of a local oscillator signal at an input to a matrix phase comparator of a phase-locked loop (PLL);
   forming at least three partial phase-error signals by comparing a single phase of the at least one phase of the reference signal to corresponding phases of the at least three phases of the local oscillator signal;
   applying a respective weighting factor to each partial phase-error signal of the at least three phase-error signals, wherein the respective weighting factors applied to each partial phase-error signal collectively form a discrete time domain filter weighting configuration that adds at least one of a zero and a pole to a transfer function of the PLL; and
   generating a composite phase-error signal by forming a summation of the at least three weighted partial phase-error signals, and responsively adjusting a fixed phase of a local oscillator using the composite phase-error signal.

2. The method of claim 1, wherein applying the respective weighting factor to each partial phase-error signal comprises controlling a magnitude of current of each partial phase-error signal.

3. The method of claim 1, wherein each partial phase-error signal of the at least three partial phase-error signals is generated using a logical exclusive OR (XOR) phase comparator operating on the single phase of the at least one phase of the reference signal and a corresponding phase of the at least three phases of the local oscillator signal.

4. The method of claim 1, wherein each partial phase-error signal of the at least three partial phase-error signals is generated using a logical exclusive NOR (XNOR) phase comparator operating on the single phase of the at least one phase of the reference signal and a corresponding phase of the at least three phases of the local oscillator signal.

5. The method of claim 1, wherein each weighted partial phase-error signal is generated at an output of a respective charge pump circuit as an analog signal, each analog signal having a magnitude determined by the respective weighting factor.

6. The method of claim 5, wherein generating the composite phase-error signal comprises forming an analog summation of the at least three weighted partial phase-error signals.

7. The method of claim 1, further comprising low-pass filtering the composite phase-error signal.

8. The method of claim 1, wherein each respective weighting factor is applied to the partial phase-error signal at a corresponding input of a weighted summation node.

9. The method of claim 1, wherein the at least one phase of the reference clock signal is obtained via an output of a multi-input comparator (MIC) configured to perform a linear combination of a set of input signals received via respective wires of a multi-wire bus, the linear combination associated with a clock-embedded sub-channel.

10. The method of claim 1, wherein the at least three phases of the local oscillator signal comprise 0, 90, 180, and 270-degree phases.

11. An apparatus comprising:
a local oscillator configured to generate at least three phases of a local oscillator signal;
a plurality of partial phase comparators of a phase-locked loop configured to obtain at least one phase of a reference signal and the at least three phases of a local oscillator signal, and to responsively generate a set of at least three weighted partial phase-error signals, each weighted partial phase-error signal generated by:
forming a comparison of one phase of the at least one phase of the reference signal to a corresponding phase of the at least three phases of the local oscillator signal; and
applying a respective weighting factor to the comparison, wherein the respective weighting factor applied to each comparison collectively form a discrete time domain filter weighting configuration that adds at least one of a zero and a pole to a transfer function of the PLL; and
a summation circuit configured to generate a composite phase-error signal by forming a summation of the at least three weighted partial phase-error signals, and to responsively adjust a fixed phase of the local oscillator using the composite phase-error signal.

12. The apparatus of claim 11, wherein each partial phase comparator is configured to apply the respective weighting factor to the comparison by controlling a current magnitude at an output of the partial phase comparator.

13. The apparatus of claim 11, wherein each partial phase comparator comprises a logical exclusive OR (XOR) configured to generate the comparison of the one phase of the reference signal to the corresponding phase of the local oscillator signal.

14. The apparatus of claim 11, wherein each partial phase comparator comprises a logical exclusive NOR (XNOR) configured to generate the comparison of the one phase of the reference signal to the corresponding phase of the local oscillator signal.

15. The apparatus of claim 11, wherein each partial phase comparator comprises a charge pump circuit configured to generate the weighted partial phase-error signal as an analog signal, the analog signal having a magnitude determined by the respective weighting factor.

16. The apparatus of claim 15, wherein the summation circuit is an analog summation circuit configured to generate the composite phase-error signal by forming an analog summation of the at least three weighted partial phase-error signals.

17. The apparatus of claim 11, further comprising a low-pass filter connected to an output of the summation circuit, the low-pass filter configured to filter the composite phase-error signal.

18. The apparatus of claim 11, further comprising a multi-input comparator (MIC) configured to generate a phase of the at least one phase of the reference clock signal, the MIC configured to perform a linear combination of a set of input signals received via wires of a multi-wire bus, the linear combination associated with a clock-embedded sub-channel.

19. The apparatus of claim 11, wherein the at least one phase of the reference signal and the at least three phases of the local oscillator signal comprise 0, 90, 180, and 270-degree phases.

20. The apparatus of claim 11, wherein the at least one phase of the reference signal and the at least three phases of the local oscillator signal comprise 0, 45, 90, 135, 180, 225, 270, and 315-degree phases.

* * * * *